US009177811B2

(12) United States Patent
Moriwaka

(10) Patent No.: US 9,177,811 B2
(45) Date of Patent: Nov. 3, 2015

(54) METHOD FOR MANUFACTURING SEMICONDUCTOR DEVICE

(75) Inventor: Tomoaki Moriwaka, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 686 days.

(21) Appl. No.: 12/076,585

(22) Filed: Mar. 20, 2008

(65) Prior Publication Data

US 2008/0233689 A1    Sep. 25, 2008

(30) Foreign Application Priority Data

Mar. 23, 2007   (JP) ................................ 2007-077217

(51) Int. Cl.
| | |
|---|---|
| H01L 21/20 | (2006.01) |
| H01L 21/285 | (2006.01) |
| H01L 29/04 | (2006.01) |
| H01L 29/417 | (2006.01) |
| H01L 29/45 | (2006.01) |
| H01L 27/12 | (2006.01) |
| H01L 21/02 | (2006.01) |

(52) U.S. Cl.
CPC ...... *H01L 21/28518* (2013.01); *H01L 27/1285* (2013.01); *H01L 29/045* (2013.01); *H01L 29/41733* (2013.01); *H01L 29/458* (2013.01); *H01L 21/02532* (2013.01); *H01L 21/02691* (2013.01)

(58) Field of Classification Search
USPC ........... 438/166, 487, 662; 765/166, 487, 662
See application file for complete search history.

(56) References Cited

U.S. PATENT DOCUMENTS

| | | | |
|---|---|---|---|
| 4,915,772 A * | 4/1990 | Fehlner et al. ................... 117/44 |
| 5,313,076 A | 5/1994 | Yamazaki et al. | |
| 5,648,277 A | 7/1997 | Zhang et al. | |
| 5,808,318 A * | 9/1998 | Masumo et al. ................ 257/66 |
| 5,962,869 A | 10/1999 | Yamazaki et al. | |
| 6,218,678 B1 | 4/2001 | Zhang et al. | |
| 6,331,476 B1 * | 12/2001 | Kawakita et al. ............. 438/486 |
| 6,391,747 B1 | 5/2002 | Okumura et al. | |

(Continued)

FOREIGN PATENT DOCUMENTS

| | | |
|---|---|---|
| JP | 61-185917 | 8/1986 |
| JP | 62-165908 | 7/1987 |

(Continued)

OTHER PUBLICATIONS

A. Hara et al., "Ultra-high Performance Poly-Si TFTs on a Glass by a Stable Scanning CW Laser Lateral Crystallization", AM-LCD '01, Digest of Technical, pp. 227-230, (2001).

*Primary Examiner* — Mark Tornow
(74) *Attorney, Agent, or Firm* — Nixon Peabody LLP; Jeffrey L. Costellia

(57) ABSTRACT

The invention relates to a method for forming a uniform silicide film using a crystalline semiconductor film in which orientation of crystal planes is controlled, and a method for manufacturing a thin film transistor with less variation in electric characteristics, which is formed over an insulating substrate using the silicide film. A semiconductor film over which a cap film is formed is irradiated with a laser to be crystallized under the predetermined condition, so that a crystalline semiconductor film including large grain crystals in which orientation of crystal planes is controlled in one direction is formed. The crystalline semiconductor film is used for silicide, whereby a uniform silicide film can be formed.

19 Claims, 21 Drawing Sheets

(56) References Cited

U.S. PATENT DOCUMENTS

| | | |
|---|---|---|
| 6,475,839 B2 | 11/2002 | Zhang et al. |
| 6,617,612 B2 | 9/2003 | Zhang et al. |
| 6,908,797 B2 | 6/2005 | Takano |
| 7,238,557 B2 | 7/2007 | Hayakawa |
| 7,709,309 B2 | 5/2010 | Moriwaka |
| 7,834,356 B2 | 11/2010 | Hayakawa |
| 7,972,943 B2 | 7/2011 | Moriwaka |
| 7,981,701 B2 | 7/2011 | Hatano et al. |
| 8,043,905 B2 | 10/2011 | Hayakawa |
| 8,338,830 B2 | 12/2012 | Takano |
| 2005/0169330 A1 | 8/2005 | Hongo et al. |
| 2006/0088986 A1* | 4/2006 | Lin et al. ............... 438/482 |
| 2007/0020932 A1* | 1/2007 | Maruyama et al. ....... 438/687 |
| 2007/0087488 A1 | 4/2007 | Moriwaka |
| 2007/0178672 A1 | 8/2007 | Tanaka et al. |
| 2007/0222038 A1 | 9/2007 | Moriwaka |
| 2010/0207253 A1 | 8/2010 | Moriwaka |

FOREIGN PATENT DOCUMENTS

| | | |
|---|---|---|
| JP | 63-299322 | 12/1988 |
| JP | 07-135324 | 5/1995 |
| JP | 2000-228360 | 8/2000 |
| JP | 2001-338894 | 12/2001 |
| JP | 2003-218362 | 7/2003 |
| JP | 2004-048029 | 2/2004 |
| JP | 2004-165436 | 6/2004 |
| JP | 2005-117029 A | 4/2005 |
| JP | 2005-217209 | 8/2005 |
| JP | 2005-277062 | 10/2005 |
| JP | 2008-252076 A | 10/2008 |

* cited by examiner

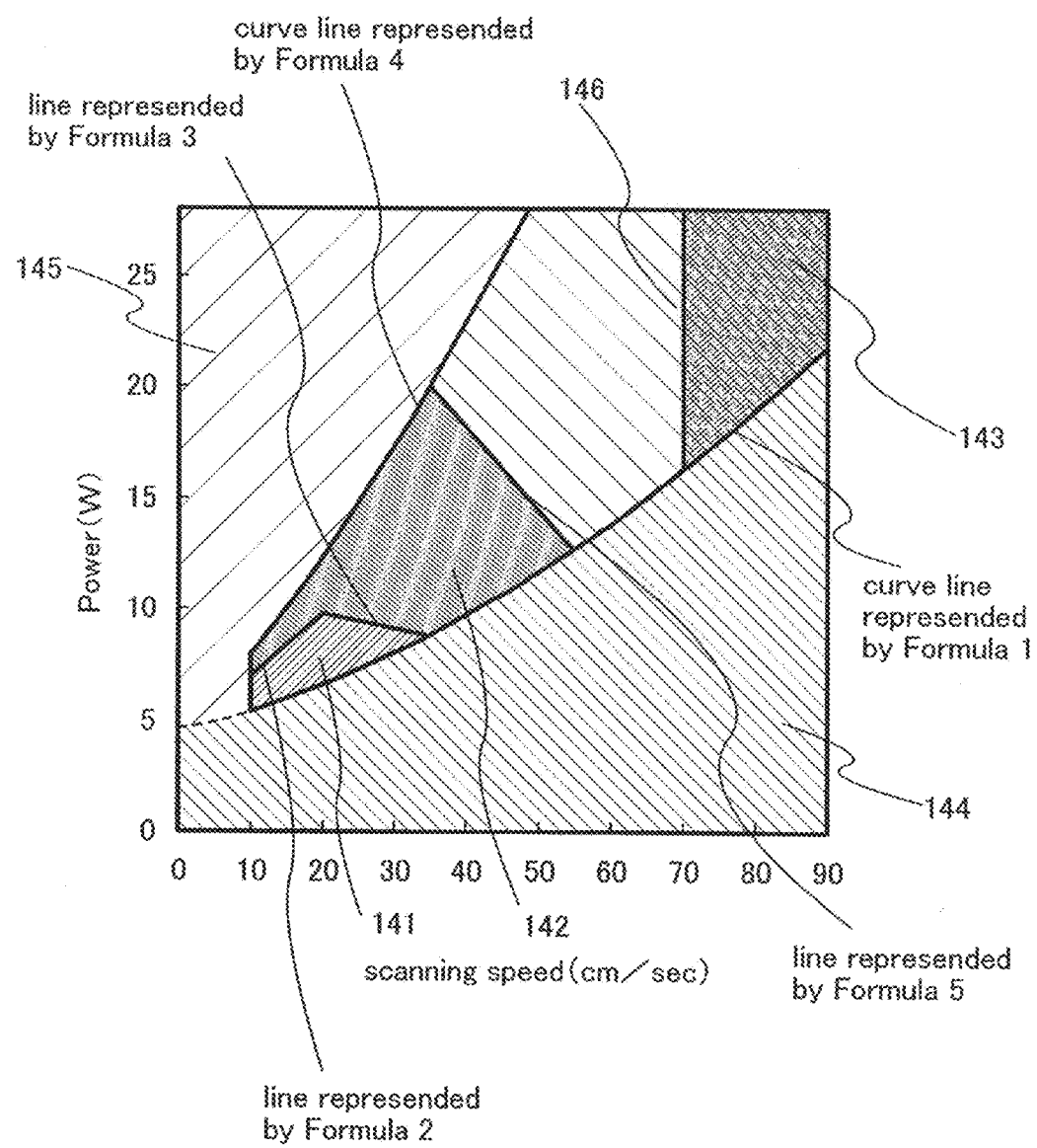

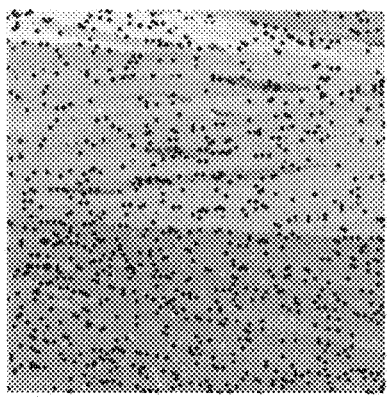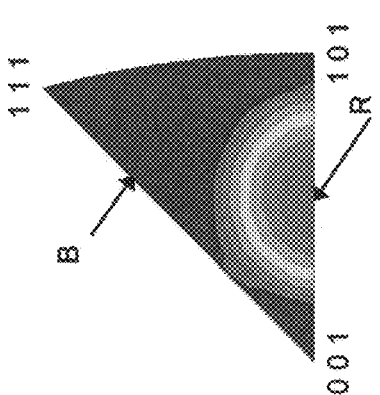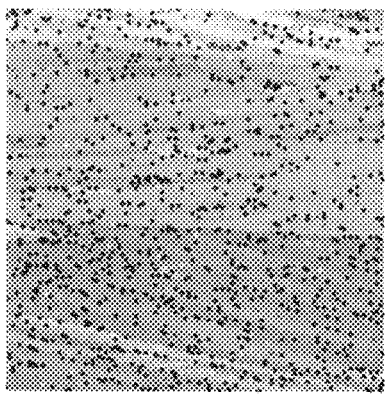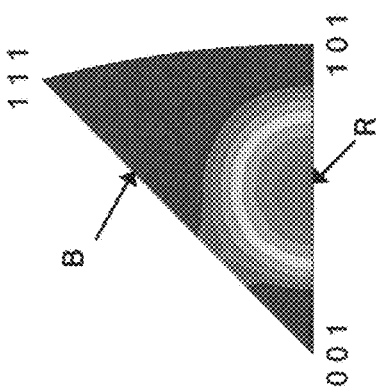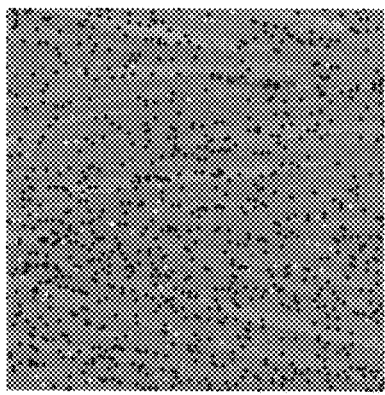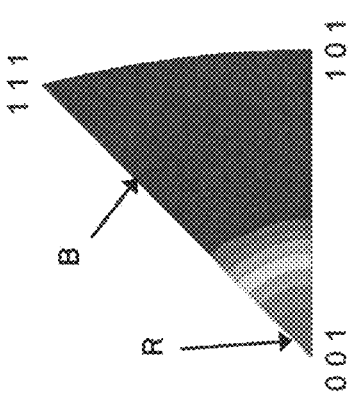

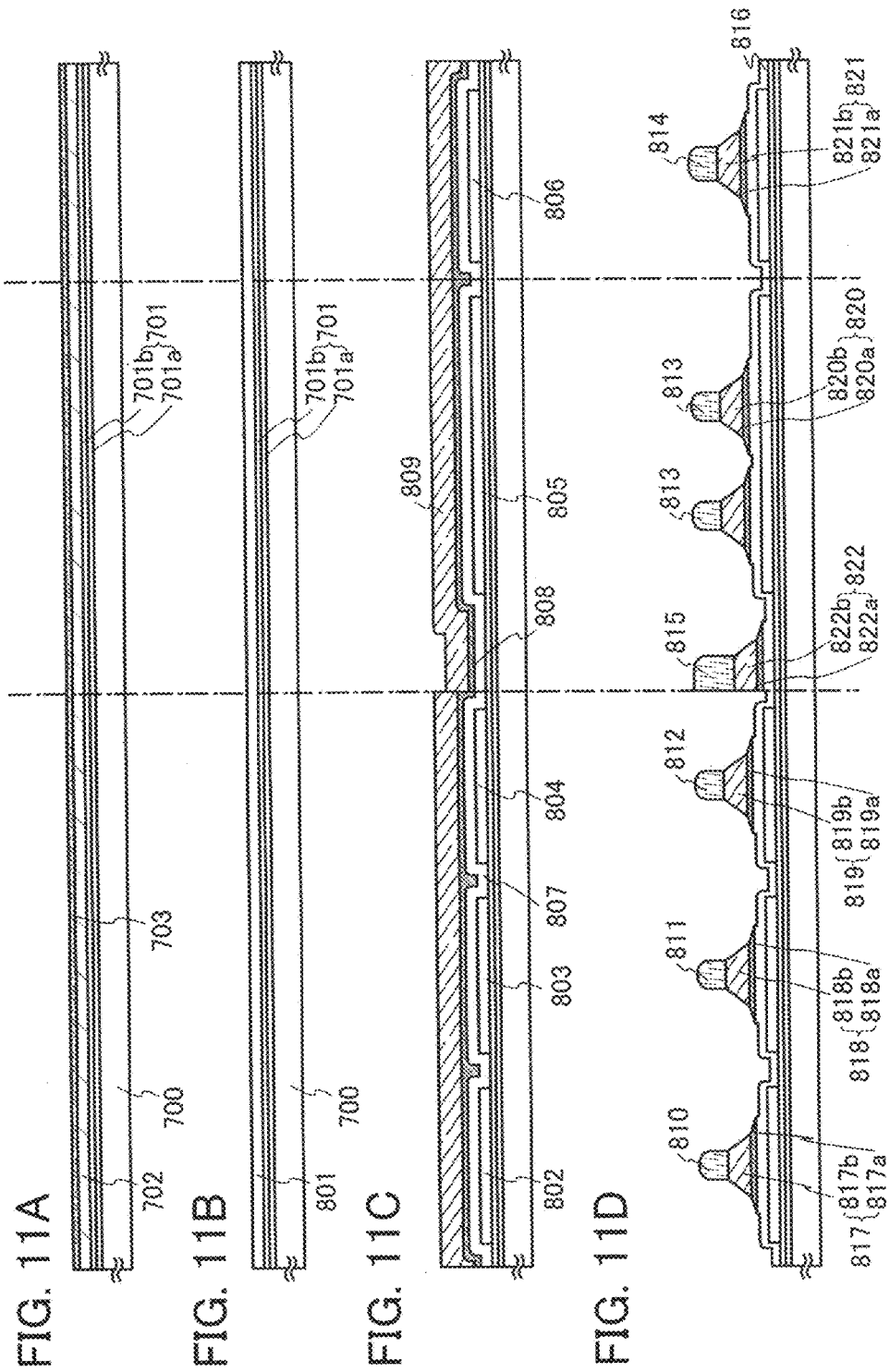

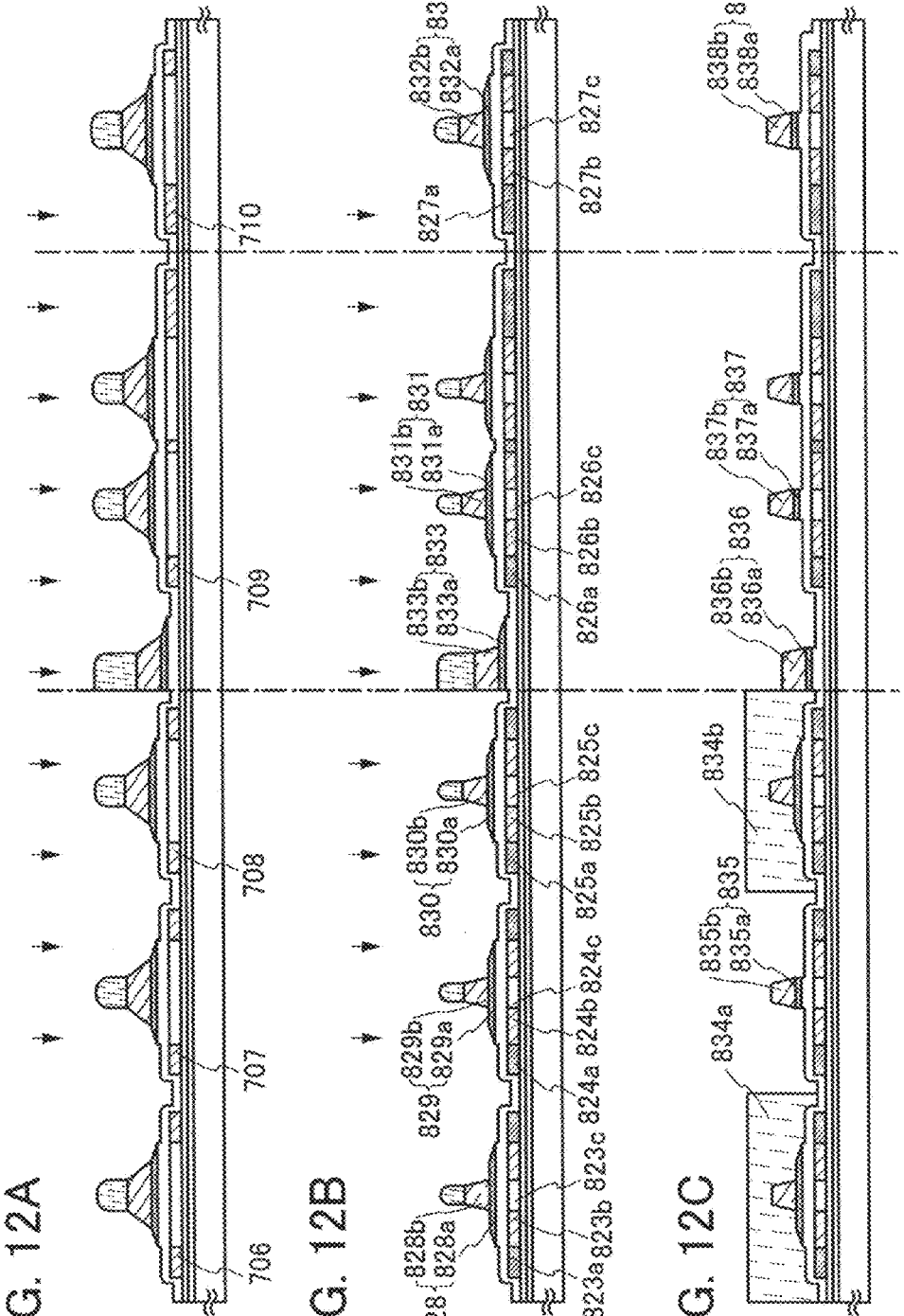

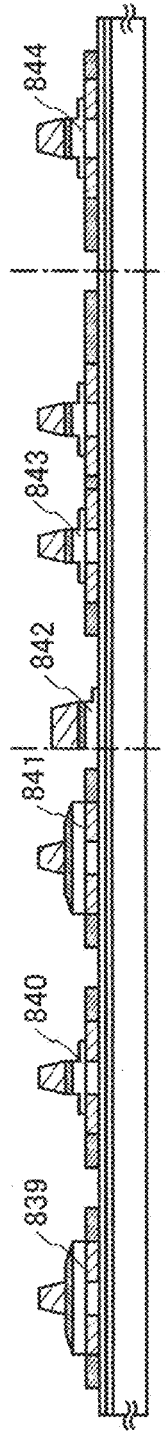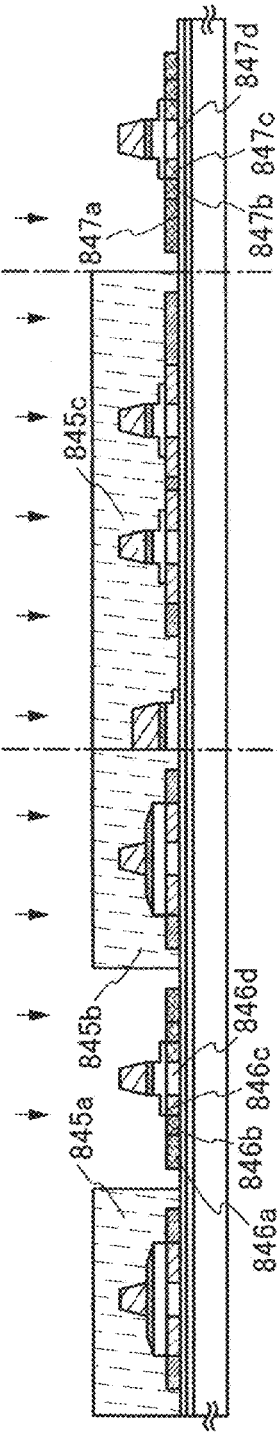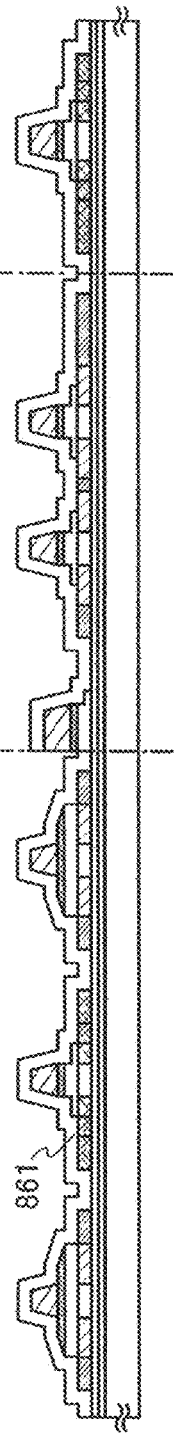

METHOD FOR MANUFACTURING SEMICONDUCTOR DEVICE

BACKGROUND OF THE INVENTION

1. Field of the Invention

The present invention relates to a method for manufacturing a semiconductor device with high characteristics. Note that a semiconductor device in the present specification generally indicates a device capable of functioning by utilizing semiconductor characteristics, and electro-optic devices, semiconductor circuits, and electronic devices are all semiconductor devices.

2. Description of the Related Art

In accordance with reduction in size of an integrated circuit, a semiconductor device which forms the integrated circuit is required to have lower contact resistance between a metal wiring and a semiconductor film and lower resistance of an impurity region in the semiconductor film. Therefore, a technique in which contact resistance and resistance of an impurity region are reduced by forming a silicide film on the semiconductor film has been adopted in a semiconductor field. When resistance of a semiconductor film is reduced, ON current of a semiconductor device is improved and a semiconductor device with high characteristics can be manufactured.

The silicide film is usually formed as follows: a CW (continuous-wave) laser or a pulsed laser with high repetition rate of 10 MHz or more (pseudo CW laser) is formed into a beam spot; an amorphous semiconductor film is irradiated with the laser; a solid-liquid interface to be formed by laser irradiation is moved to generate lateral crystal growth, so that a crystalline semiconductor film is formed; a metal film is formed thereover; and heat treatment is performed to react the crystalline semiconductor film and the metal film, whereby a silicide film is formed in the interface therebetween (for example, Reference 1: Japanese Published Patent Application No. H7-135324).

The crystalline semiconductor film obtained by the lateral crystal growth has characteristics that the crystals each have a large grain size and orientation of crystal planes in adjacent crystals with a large grain size is entirely different. The orientation of crystal planes in each crystal with a large grain size (hereinafter, referred to as large grain crystal) formed in a region irradiated with a laser beam is random; therefore, orientation of crystal planes in large grain crystals cannot be controlled in one direction.

Composition and a grow rate of the silicide to be formed is determined depending on the relation of surface energy between the semiconductor film and the silicide film to be formed. Accordingly, the silicide reaction between the metal film and the above crystalline semiconductor film in which the orientation of crystal planes in adjacent large grain crystals is random reflects random orientation of crystal planes in the semiconductor film. Thus, there is a problem in that composition and a thickness of silicide to be formed are not uniform.

SUMMARY OF THE INVENTION

In view of the foregoing problem, it is an object of the present invention to form a uniform silicide film using a crystalline semiconductor film in which orientation of crystal planes is controlled and to realize miniaturization and high performance of a field effect transistor which has little variation of electric characteristics formed over an insulating substrate.

When a large amount of heat is supplied to the semiconductor film at one time, the semiconductor film is completely melted, and a large quantity of crystal nuclei is generated in the semiconductor film. Then, disordered crystal growth is cased by these crystal nuclei. This is a reason of random orientation in crystal planes of crystals that are laterally grown with the use of a CW laser or a pseudo CW laser.

It has been considered by the inventor of the present invention that suppression of disordered crystal growth is important to control the orientation of crystal planes. As a result of research, it has been found that a cap film is formed over an amorphous semiconductor film that is formed over an insulating substrate such as a glass substrate, and irradiation with a laser beam for lateral crystal growth by laser crystallization is performed under the predetermined conditions, whereby a crystalline semiconductor film including large grain crystals in which orientation of crystal planes is controlled in one direction can be formed. When a metal film is formed over the above-described crystalline semiconductor film in which orientation of crystal planes is controlled in one direction, and a silicide film is formed by heat treatment, silicide reaction between the semiconductor film and the metal film proceeds without influence of dependency on orientation of crystal planes; therefore, a silicide film with extremely uniform in the film plane can be formed.

Note that silicide in this specification indicates general compounds of semiconductor and metal as well as a compound of silicon and a metal.

By irradiating the semiconductor film over which the cap film is formed with a laser to be crystallized under the predetermined conditions, a crystalline semiconductor film including large grain crystals in which orientation of crystal planes is controlled in one direction can be obtained. When the crystalline semiconductor film is used for silicide, random silicide reaction that is dependent on orientation of crystal planes can be suppressed; therefore, a uniform silicide film can be formed. Accordingly, a semiconductor device with little variation can be manufactured. As a result, miniaturization and high performance of a filed effect transistor can be realized.

BRIEF DESCRIPTION OF THE DRAWINGS

FIG. 4 is a diagram showing conditions of a laser beam and orientation of crystal planes in Embodiment Mode 2 of the present invention.

FIGS. 5A to 5F are diagrams each showing an observation result of a sample in Embodiment Mode 2 of the present invention.

FIGS. 11A to 11D are cross-sectional views illustrating a manufacturing step of an active matrix substrate in Embodiment 1 of the present invention.

FIGS. 12A to 12C are cross-sectional views illustrating a manufacturing step of an active matrix substrate in Embodiment 1 of the present invention.

FIGS. 13A to 13C are cross-sectional views illustrating a manufacturing step of an active matrix substrate in Embodiment 1 of the present invention.

DETAILED DESCRIPTION OF THE INVENTION

Figure 1A:
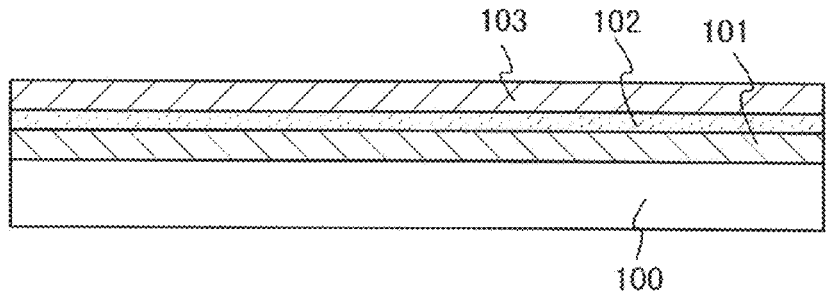
FIGS. 1A to 1D are diagrams illustrating a method for manufacturing a semiconductor device in Embodiment Mode 1 of the present invention.

Embodiment modes of the present invention will be described with reference to the accompanying drawings. Note that the present invention can be implemented in various modes, and it is easily understood by those skilled in the art that modes and details can be modified in various ways without departing from the purpose and the scope of the present invention. Accordingly, the present invention should not be interpreted as being limited to the description of the embodiment modes below. Note that like portions in the drawings may be denoted by the like reference numerals, and repetition explanation thereof is omitted.

Embodiment Mode 1

In this embodiment mode, a cap film is formed over an amorphous semiconductor film, and the amorphous semiconductor film is irradiated with a continuous wave laser beam or a pulsed laser beam with repetition rate of 10 MHz or more under the predetermined conditions through the cap film, so that a crystalline semiconductor film in which crystal planes in a perpendicular direction to a surface are orientated along {001} is formed. Then, an example in which silicide films are formed in a top gate TFT in which the crystalline semiconductor film is used for a source region and a drain region is described. FIGS. 1A to 2C are diagrams illustrating manufacturing steps thereof.

In FIGS. 1A to 1D, an insulating film 101 functioning as a base film is formed on one of insulating surfaces of a substrate 100. The insulating film 101 functioning as a base film is formed using a silicon oxide film, a silicon nitride film, a silicon nitride oxide film containing a larger amount of nitrogen than that of oxygen, a silicon oxynitride film containing a larger amount of oxygen than that of nitrogen, each of which has a thickness of 50 to 150 nm, or the like as appropriate. Here, as the substrate 100 having an insulating surface, a glass substrate with a thickness of 0.7 mm is, for example, used. Further, as the insulating film 101 functioning as a base film, a silicon nitride oxide film with a thickness of 50 nm and a silicon oxynitride film with a thickness of 100 nm are formed by a plasma CVD method.

Next, an amorphous silicon film with a thickness of greater than or equal to 10 nm and less than or equal to 100 nm, preferably, greater than or equal to 20 nm and less than or equal to 80 nm, is formed as a semiconductor film 102 over the insulating film 101 by a plasma CVD method.

In the case where the semiconductor film 102 is an amorphous silicon film, after formation of the semiconductor film 102, the semiconductor film 102 may be heated. The heat treatment is for extracting hydrogen from the amorphous silicon film. Note that hydrogen is extracted so as to prevent a hydrogen gas from jetting from the semiconductor film 102 when irradiation with a laser beam, and the heat treatment can be omitted if the amount of hydrogen contained in the semiconductor film 102 is small. Here, the semiconductor film 102 is heated in an electric furnace at 500° C. for 1 hour.

Next, a $SiN_xO_y$ film ($0 \leq x \leq 4/3$, $0 \leq y \leq 2$, $0 \leq 3x+2y \leq 4$) with a thickness of greater than or equal to 200 nm and less than or equal to 1000 nm is formed as a cap film 103 over the semiconductor film 102. It is particularly to be noted that if the cap film 103 is too thin, it will become difficult to control orientation of crystal planes in a crystalline semiconductor film that is formed later; therefore, the cap film 103 is preferably formed with a thickness of greater than or equal to 200 nm and less than or equal to 1000 nm.

The cap film 103 can be formed using a silicon oxide film, a silicon nitride film, a silicon oxynitride (hereinafter, refer to as $SiO_xN_y$ ($x<y$)) film containing a larger amount of oxygen than that of nitrogen, a silicon nitride oxide (hereinafter, refer to $SiN_xO_y$ ($x>y$)) film containing a larger amount of nitrogen than that of oxide, or the like. In a case where a large amount of hydrogen is contained in the cap film 103, heat treatment for extracting hydrogen is performed similarly to the case of the semiconductor film 102.

As the cap film 103, a film having enough transmittance with respect to a wavelength of the laser beam, and having a thermal value such as a thermal expansion coefficient and a value such as ductility close to those of the adjacent semiconductor film 102 is preferably used. Further, the cap film 103 is preferably a solid and dense film with low etching rate similarly to a gate insulating film of a thin film transistor to be formed later. Such a solid and dense film can be formed by reducing a deposition rate, for example.

When a solid and dense film is formed as the cap film 103, appropriate loads are given to the semiconductor film 102 in melting and solidification of the semiconductor film 102, whereby the volume change is suppressed and stable crystal growth is promoted. Further, irradiation with a laser beam is performed with a power that is slightly higher than a lower limit of power density that makes the semiconductor film 102 completely to be melted. In such a manner, heat quantity applied to the semiconductor film 102 is reduced to necessity minimum, whereby generation of crystal nuclei more than needs and reduction in viscosity of the melted semiconductor film 102 are suppressed, and generation of turbulent flow, that is, disordered crystal growth is suppressed. As a result, orientation of crystal planes in the crystalline semiconductor film can be easily controlled.

As described above, the semiconductor film 102 over which the cap film 103 is formed is irradiated with a CW laser or a pseudo CW laser under the predetermined conditions while the substrate 100 is scanned, and crystal is laterally grown, so that a crystalline semiconductor film 106 including large grain crystals in which orientation of plane crystals is controlled in one direction can be formed.

Figure 1B:
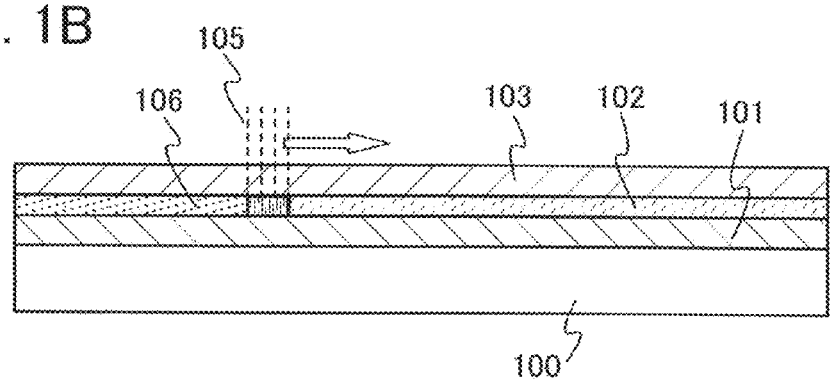

Next, as shown in FIG. 1B, by irradiating part of the semiconductor film 102 with a laser beam 105, whereby the semiconductor film 102 is melted, so that a crystalline semiconductor film 106 in which surface crystal planes are orientated along {001} is formed. For example, when the power of the laser beam 105 is 8.4 W and the scanning speed thereof is 20 cm/second, 40% or more of surfaces of crystals planes in the crystalline semiconductor film 106 are orientated along {001}.

The semiconductor film 102 can be irradiated with the laser beam 105 from the cap film 103 side. When the substrate 100 has a light-transmitting property, the semiconductor film 102 can be irradiated from the substrate 100 side. Here, the semiconductor film 102 is irradiated with the laser beam 105 from the cap film 103 side.

The power of the laser beam 105 is preferably the low limit power of melting the semiconductor film 102 completely or the power that is slightly higher than the low limit power. By reducing the heat quantity that is applied to the semiconductor film 102 to the necessity minimum, turbulent flow of melt of the semiconductor can be suppressed, and generation of crystal nuclei more than needs due to turbulent flow can be suppressed. As a result, large grain crystals can be formed.

Next, the cap film 103 over the crystalline semiconductor film 106 is removed. Typically, a mixture solution containing ammonium hydrogen fluoride and ammonium fluoride or a hydrofluoric aqueous solution can used for removing the cap film 103 in the case of wet etching, and a hydrofluorocarbon gas can be used for removing the cap film 103 in the case of dry etching.

Note that the thickness of the crystalline semiconductor film 106 may be reduced here. Typically, etching may be performed so as to reduce the entire thickness of the crystalline semiconductor film 106 to greater than or equal to 10 nm and less than or equal to 30 nm. Furthermore, a surface of the crystalline semiconductor film 106 is coated with resist, exposure and development are performed to form resists in desired shapes, and the crystalline semiconductor film 106 is etched into desired shapes using the resist as a mask. After that, the thickness of the crystalline semiconductor film 106 with desired shape may be reduced. Specifically, etching may be performed so that the crystalline semiconductor film 106 with the desired shape has a thickness of greater than or equal to 10 nm and less than or equal to 30 nm. When a thin film transistor is formed using such a thin crystalline semiconductor film 106, a fully depleted thin film transistor is obtained, so that a thin film transistor with high mobility can be manufactured.

Figure 1C:
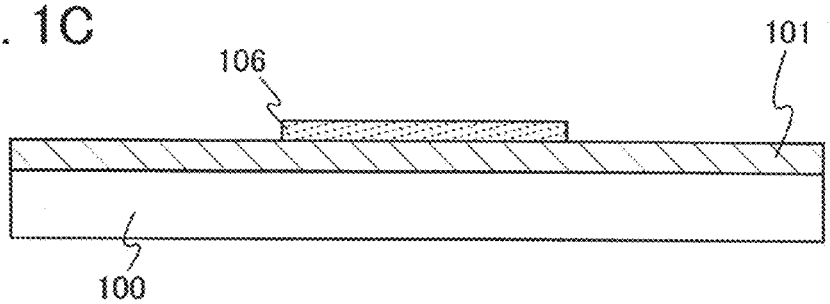

Next, as shown in FIG. 1C, the crystalline semiconductor film 106 is selectively etched into an island shape. As an etching method of the crystalline semiconductor film, a dry etching, a wet etching, or the like can be used. Here, the surface of the crystalline semiconductor film is coated with resist, and then exposure and development are performed to form a resist mask. The crystalline semiconductor film 106 is selectively etched by a dry etching method with flow rate of $SF_6:O_2$ set to be 4:15 using the formed resist mask, and thereafter, the resist mask is removed.

Figure 1D:
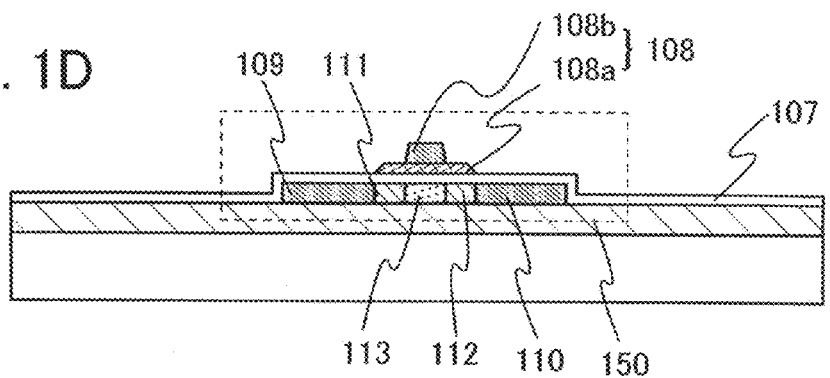

Then, as shown in FIG. 1D, a gate insulating film 107 is formed over the crystalline semiconductor film 106. The gate insulating film 107 is formed of a single layer using $SiN_x$, $SiN_xO_y$ (x>y), $SiO_2$, $SiN_xO_y$ (x<y), or the like or a stacked structure thereof. Here, a 40-nm-thick $SiN_xO_y$ (x<y) film is formed by a plasma CVD method. Then, a gate electrode 108 is formed. The gate electrode 108 can be formed using metal or a crystalline semiconductor doped with an impurity imparting one conductivity type.

In the case of using a metal for the gate electrode 108, tungsten (W), molybdenum (Mo), titanium (Ti), tantalum (Ta), aluminum (Al), or the like can be used. Moreover, metal nitride obtained by nitriding the above metal can also be used. Alternatively, a structure in which a first layer including the metal nitride and a second layer including the metal are stacked may be used. Also, a paste including particles can be discharged over the gate insulating film by a droplet discharging method, and the paste is dried and baked to form the gate electrode 108. Further, a paste including particles can be printed over the gate insulating film by a printing method, and the paste is dried and baked to form the gate electrode 108. Typical examples of the particles are: gold, silver, copper, alloy of gold and silver, alloy of gold and copper, alloy of silver and copper, alloy of gold, silver, and copper, or the like.

Here, a tantalum nitride film 108a with a thickness of 30 nm and a tungsten film 108b with a thickness of 370 nm are formed by a sputtering method over the gate insulating film 107. After that, a resist mask formed by photolithography is used to etch the tantalum nitride film 108a and the tungsten film 108b selectively, and the gate electrode 108 having a shape in which an end of the tantalum nitride film 108a extends out farther to the outside than an end of the tungsten film 108b is formed.

Next, an impurity element imparting n-type conductivity, for example, is added to the crystalline semiconductor film 106 using the gate electrode 108 as a mask, so that a drain region 109 and a source region 110 are formed.

Further, low concentration impurity regions 111 and 112 that partly overlap with the gate electrode 108 are formed. Furthermore, a channel region 113 that overlaps with the gate electrode 108 is formed.

Note that the drain region 109, the source region 110, and the low concentration impurity regions 111 and 112 are doped with phosphorus that is an impurity element imparting n-type conductivity. An impurity element may be As or the like.

After that, heat treatment is performed for activating the impurity element that is added to the semiconductor layer. Here, heat treatment is performed in a nitrogen atmosphere at 550° C. for four hours. Through the above steps, an n-channel TFT 150 is formed.

Figure 2A:
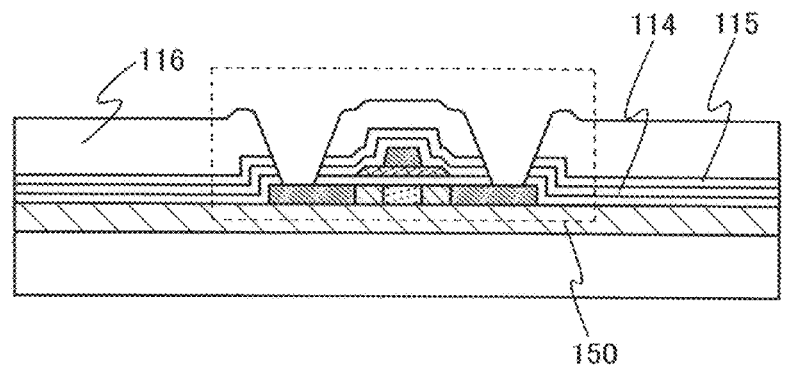
FIGS. 2A to 2C are diagrams illustrating a method for manufacturing a semiconductor device in Embodiment Mode 1 of the present invention.

Next, as shown in FIG. 2A, an interlayer insulating film that insulates the gate electrode and a wiring of the TFT 150 is formed. Here, as the interlayer insulating film, a silicon oxide film 114, a silicon nitride film 115, and a silicon oxide film 116 are stacked and hydrogenated.

Then, a resist pattern is formed over the interlayer insulating films, and the interlayer insulating films are etched using this resist pattern as a mask, whereby contact holes that reach the drain region 109 and the source region 110 are formed. As a result, the drain region 109 and the source region 110 are partially exposed.

Figure 2B:
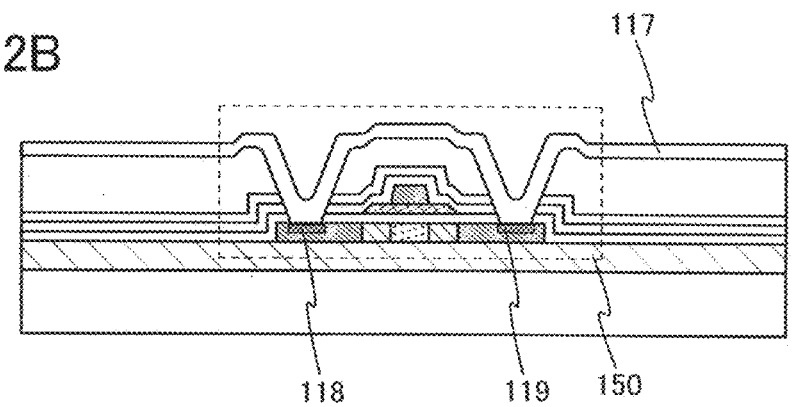
Figure 2C:
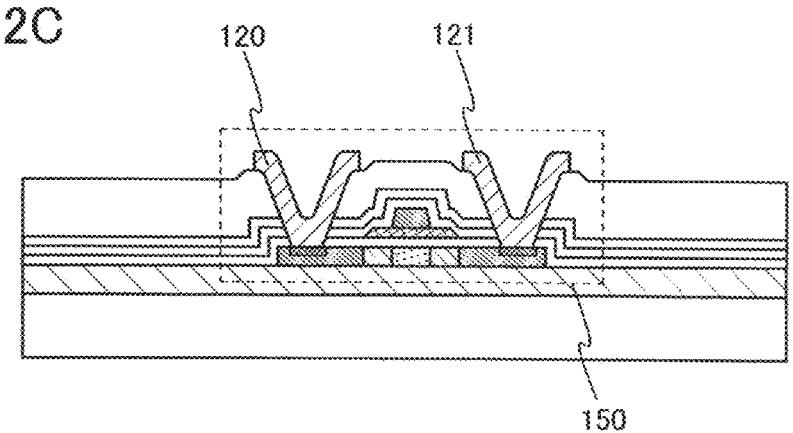

Next, as shown in FIG. 2B, the exposed surface of the crystalline semiconductor film is washed with hydrofluoric acid; thereafter, a metal film 117 with a thickness of 5 to 30 nm is formed by a sputtering method so as to entirely cover the exposed drain region 109 and the exposed source region 110. Here, the metal film 117 preferably contains Ni, Co, Pt, Pd, or Cr as its main component. Then, heat treatment is performed. By this step, silicide reaction is generated in portions where the drain region 109 and the source region 110 that are a crystalline semiconductor film are contacted to the metal film, so that silicide films 118 and 119 are formed.

Silicide reaction depends on orientation of crystal planes in the crystalline semiconductor film. For example, it is known that $NiSi_2$, $CoSi_2$, or the like is easily grown on a surface of a silicon film in which crystal planes are orientated along {001}, and PtSi, $PdSi_2$, $NiSi_2$, $CoSi_2$, $CrSi_2$, or the like is easily grown on a surface of a silicon film in which crystal planes are orientated along {111}. Accordingly, by the reaction with the above metal film formed over the crystalline semiconductor film in which orientation of crystal planes is controlled in one direction, silicide films in which composition is further uniform can be formed.

Note that in the case where a gate electrode is a crystalline semiconductor film to which conductivity is imparted, it is possible to form a silicide film on the gate electrode as well.

Next, the unreacted metal is removed using a known etchant. Resistance of the source and drain regions can be sufficiently lowered by the step of forming the silicide film. Accordingly, activation of the n-type impurity thereafter is unnecessary. Needless to say, heat treatment, irradiation with intense light, or irradiation with laser light can be performed for activation of the n-type impurity.

Then, a conductive film (for example, an Al alloy wiring) is formed over the interlayer insulating film and the contact holes, and this conductive film is patterned, so that a drain electrode 120 and a source electrode 121 are formed. Through the steps, the TFT 150 (n-channel TFT) can be formed.

Note that, in this embodiment mode, an example is shown in which after formation of the interlayer insulating films over the TFT, the silicide films are formed using exposed portions in the drain region 109 and the source region 110 due to the contact hole. However, it is not limited thereto. For example, after, an impurity ion is introduced, the gate insulating film 107 is removed using the gate electrode as a mask, and then, a metal film is formed and heated, whereby silicide films can be formed. Alternatively, after the gate insulating film 107 is removed using the gate electrode as a mask, an impurity ion is introduced, and then, a metal film is formed and heated, so that silicide films can be formed. After that, a TFT can be manufactured by the usual process.

The present invention is not limited to the TFT structure shown in this embodiment mode and can be applied to TFTs having other structures. For example, a structure in which an LDD region is arranged by overlapping with the gate electrode with the gate insulating film interposed therebetween, that is, a GOLD (Gate-drain Overlapped LDD) structure, may be employed.

Although this embodiment mode is described using the n-channel TFT, it is needless to say that a p-channel TFT can be formed using a p-type impurity element instead of the n-type impurity element. Although this embodiment mode gives an example of a top gate TFT, for example, an inversely staggered TFT can be employed.

Further, although this embodiment mode shows an example in which surface crystal planes in the crystalline semiconductor film 106 are orientated along {001}, it is not limited thereto. By adjusting conditions of laser irradiation or the like, for example, a crystalline semiconductor film in which surface crystal planes are orientated along {211}, {101}, or {111} can be formed.

As described above, by irradiating the semiconductor film over which the cap film is formed with a laser to be crystallized under the predetermined conditions, a crystalline semiconductor film including large grain crystals in which orientation of crystal planes is controlled in one direction can be obtained. When the crystalline semiconductor film is used for silicide, the random silicide reaction that is dependent on random orientation of crystal planes in the crystalline semiconductor film can be suppressed, so that a uniform silicide film can be formed. Accordingly, a semiconductor device with further little variation can be manufactured. Thus, miniaturization and high performance of a field effect transistor for example, can be realized.

Composition ratio, a resistance value, a thickness to be grown, and an interface state of silicide to be formed depends on orientation of crystal planes in a crystalline semiconductor film, and the orientation is different depending on kinds of metal reacted with the crystalline semiconductor film. Accordingly, in order to form a silicide film with further high quality on the crystalline semiconductor film, optimal orientation of crystal planes is needed to be selected for every metal to be reacted. When an amorphous semiconductor film over which the cap film is formed is laterally grown using a CW laser or a pseudo CW laser, by controlling the laser power and the scanning speed, a melting state can be controlled. That is, by controlling the laser irradiation condition, a crystalline semiconductor film including large grain crystals in which orientation of crystal planes is controlled in given orientation can be formed, so that a silicide film with further high quality can be formed.

Since orientation of crystal planes in the crystalline semiconductor film that can be formed can be controlled in given orientation by control of laser irradiation conditions, an optimal silicide film can be obtained depending on a metal used for silicide, and a semiconductor device with high performance can be manufactured.

Further, by forming a cap film and growing crystals laterally, a crystalline semiconductor film whose surface is extremely flat can be formed, so that a semiconductor device with small leak current and high withstand voltage can be manufactured.

Embodiment Mode 2

This embodiment mode will describe a method for forming a crystalline semiconductor film including large grain crystals in which orientation of crystal planes is controlled in one direction in detail, which is used in a method for forming a silicide film described in Embodiment Mode 1.

A cap film is formed over an amorphous semiconductor film, and the amorphous semiconductor film is irradiated through the cap film with a continuous wave laser beam or a pulsed laser beam with repetition rate of 10 MHz or more with the predetermined laser power at scanning speed. As a result, a crystalline semiconductor film including crystals in which crystal planes in the perpendicular direction to the surface are orientated along {001}, {211}, or {101} can be manufactured. Hereinafter, a method thereof is described with reference to drawings.

Figure 3:
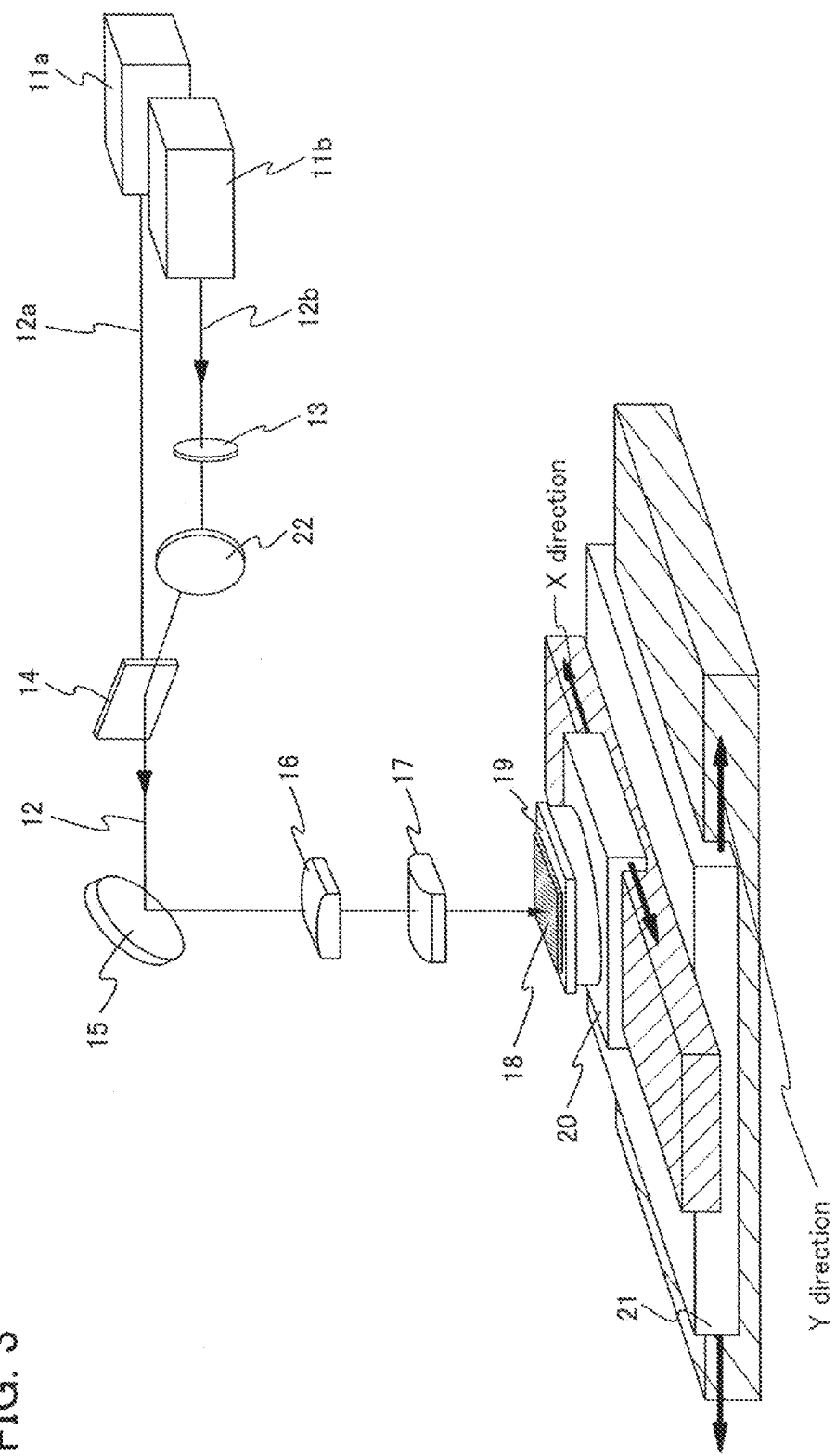
FIG. 3 is a diagram showing an optical device used for manufacture of a crystalline semiconductor film in Embodiment Mode 2 of the present invention.

First, an optical system is described. FIG. 3 is a diagram showing an optical system including laser oscillators that are used in crystallization by irradiating the amorphous semiconductor film with a laser beam for forming a beam spot.

In FIG. 3, for laser oscillators 11a and 11b, a laser oscillator emitting a laser with a wavelength, which is absorbed in the semiconductor film to be crystallized, by several ten % or more is used. Typically, a second harmonic or a third harmonic can be used. Here, a continuous laser with LD excitation (Laser Diode) ($YVO_4$, a second harmonic (a wavelength of 532 nm)), maximum output of which is 20 W, is prepared. It is not necessary to particularly limit the wavelength of the laser to a second harmonic, but the second harmonic is superior to a further higher other harmonic in terms of energy efficiency.

Laser power used in the present invention is within a range which can completely melt the semiconductor film and within a range which can form a crystalline semiconductor film with a surface in which crystal planes are orientated along with {001}, {211}, or {101}. When laser power that is lower than this range is used, the semiconductor film cannot be completely melted, and a crystalline semiconductor film in which crystal grains have small sizes and crystal planes are not aligned in one direction is formed. Therefore, two laser oscillators are prepared in the case of FIG. 3; however, just one laser oscillator is enough as long as the output is sufficient. When laser power higher than this range is used, many crystal nuclei are generated in the semiconductor film, and from the crystal nuclei, disordered crystal growth is generated; thus, a crystalline semiconductor film with uneven position of crystal grains, size thereof, and orientation of crystal planes therein is formed.

When the semiconductor film is irradiated with the continuous wave laser, energy is continuously given to the semiconductor film; therefore, when the semiconductor film is once brought to a melted state, the melted state can be kept. Further, a solid-liquid interface of the semiconductor film is moved by scanning the semiconductor film with the continuous wave laser beam to form long crystal grains in one direction along this moving direction. A solid laser is used at that time because, as compared to a gas laser or the like, its output has high stability and stable process is expected.

Note that, without limitation to the continuous wave laser, it is possible to use a pulsed laser with a repetition rate of 10 MHz or more.

When a pulsed laser with a high repetition rate is used, the semiconductor film can always be kept in the melting state through the whole thickness, as long as a pulse interval of the laser is shorter than time from melting to solidification of the semiconductor film. Thus, a semiconductor film including long crystal grains that are laterally grown in one direction by the movement of the solid-liquid interface can be formed.

Although a $YVO_4$ laser is used for the oscillators 11a and 11b in this embodiment mode, other continuous wave lasers and pulsed lasers having a repetition rate of 10 MHz or more can also be used. For example, an Ar laser, a Kr laser, a $CO_2$ laser, or the like is given as a gas laser. A YAG laser, a YLF laser, a $YAlO_3$ laser, a $GdVO_4$ laser, a KGW laser, a KYW laser, an alexandrite laser, a Ti: sapphire laser, a $Y_2O_3$ laser, a $YVO_4$ laser, or the like is given as a solid laser. Moreover, there is a ceramic laser such as a YAG laser, a $Y_2O_3$ laser, a $GdVO_4$ laser, or a $YVO_4$ laser. As a metal vapor laser, a helium cadmium laser and the like can be given.

In addition, energy uniformity of a linear beam spot that can be obtained on the surface to be irradiated can be increased, when the laser beam can be emitted with the laser oscillation of $TEM_{00}$ (a single transverse mode) by the laser oscillators 11a and 11b, which is preferable.

Laser beams 12a and 12b are emitted with the same energy from the laser oscillators 11a and 11b, respectively. A polarization direction of the laser beam 12b emitted from the laser oscillator 11b is changed through a wavelength plate 13 because the two laser beams having polarization directions different from each other are combined at a polarizer 14.

After the laser beam 12b passes through the wavelength plate 13, the laser beam 12b is reflected by a mirror 22 and made to enter the polarizer 14. Then, the laser beam 12a and the laser beam 12b are combined at the polarizer 14 to form a laser beam 12. The wavelength plate 13 and the polarizer 14 are adjusted so that the beam that has been transmitted through the wavelength plate 13 and the polarizer 14 has appropriate energy. Note that, in this embodiment mode, the polarizer 14 is used for combining the laser beams; however, other optical elements such as a polarization beam splitter may also be used.

The laser beam 12 that is combined by the polarizer 14 is reflected by a mirror 15, and the laser beam in a cross-sectional shape is formed into a linear shape on a surface to be irradiated 18 by a cylindrical lens 16 having a focal length of, for example, 150 mm, and a cylindrical lens 17 having a focal length of, for example, 20 mm. The mirror 15 may be provided depending on an arrangement condition of an optical system of a laser irradiation apparatus.

The cylindrical lens 16 acts in a length direction of the beam spot that is formed on the surface to be irradiated 18, whereas the cylindrical lens 17 acts in a width direction thereof. Accordingly, on the surface to be irradiated 18, a linear beam spot having a length of approximately 500 μm and a width of approximately 20 μm, for example, is formed. Note that, in this embodiment mode, the cylindrical lenses are used to form the beam spot into a linear shape; however, the present invention is not limited thereto, and other optical elements such as a spherical lens may also be used. Moreover, the focal lengths of the cylindrical lenses are not limited to the above values and can be appropriately set.

Although the laser beam is shaped using the cylindrical lens 16 and 17 in this embodiment mode, an optical system for stretching the laser beam in a linear shape and an optical system for converging thin in a surface to be irradiated may be provided independently. For example, a cylindrical lens array, a diffractive optical element, an optical waveguide, or the like can be used for shaping a cross section of the laser beam in a linear shape. Alternatively, when a laser medium in a rectangular is used, it is possible to shape a cross section of the laser beam in a linear shape in an emission state.

In the present invention, as described above, a ceramic laser can be used. When the ceramic laser is used, a shape of a laser medium can be shaped relatively freely; therefore, the ceramic laser is suitable for forming such a laser beam. Note that the cross-sectional shape of the laser beam that is formed into a linear shape is preferably as narrow as possible in width, which increases an energy density of the laser beam in the semiconductor film; therefore, process time can be shortened.

Then, an irradiation method of the laser beam will be described. Since the surface to be irradiated 18, where the semiconductor film covered with the cap film is formed, is moved at a relatively high speed, the surface to be irradiated 18 is fixed to a suction stage 19. The suction stage 19 can be moved in X and Y directions in a plane parallel to the surface to be irradiated 18 by an X-axis one-axis robot 20 and a Y-axis one-axis robot 21. The one-axis robots are arranged so that the length direction of the linear beam spot corresponds to the Y axis.

Next, the surface to be irradiated 18 is made to move along the width direction of the beam spot, that is, along the X axis, and the surface to be irradiated 18 is irradiated with the laser beam. Here, a scanning speed of the X-axis one-axis robot 20 is greater than or equal to 10 cm/sec and less than or equal to 100 cm/sec, and the laser beam having an energy of greater than or equal to 2 W and less than or equal to 15 W or less is emitted from each of the two laser oscillators. The laser output after combining the laser beams is greater than or equal to 4 W and less than or equal to 30 W. A region where the semiconductor film is completely melted is formed by irradiation with the laser beam, and crystals are grown in a step of solidification, so that a crystalline semiconductor film of the present invention can be formed.

Energy distribution of the laser beams emitted from the laser oscillators in a $TEM_{00}$ mode is generally a Gaussian distribution. Note that an optical system used in irradiation with a laser beam can change a width of a region where crystal grains in which orientation of crystal planes at three surfaces perpendicular to each other are controlled are formed. For example, intensity of the laser beam can be homogenized by using a lens array such as a cylindrical lens array or a fly eye lens; a diffractive optical element; an optical waveguide; or the like.

By irradiating the semiconductor film 102 with the laser beam, intensity of which is homogenized, crystal grains in which orientation of crystal planes perpendicular to the surface is controlled can be formed in the regions irradiated with the laser beam.

In this embodiment mode, a method is used, in which the semiconductor film 102 that is the surface to be irradiated 18 is moved using the X-axis one-axis robot 20 and the Y-axis one-axis robot 21, but the present invention is not limited thereto, and the surface to be irradiated is scanned with the laser beam using an irradiation system moving method, in which the surface to be irradiated 18 is fixed while an irradiation position with the laser beam is moved; a surface to be irradiated moving method, in which the irradiation position with the laser beam is fixed while the surface to be irradiated 18 is moved; or a method in which these two methods are combined.

Note that, as described above, the energy distribution of the beam spot in a macro-axis direction, which is formed by the above-described optical system, is a Gaussian distribution. Therefore, crystals with small grain sizes (hereinafter, refer to small grain size) are formed at places where the energy density is low, at both ends of the beam spot. Thus, a part of the laser beam may be cut by providing a slit or the like in front of the surface to be irradiated 18, so that the surface to be irradiated 18 is irradiated only with energy sufficient to form crystals at a surface of a film in which orientation of crystal planes is controlled. Alternatively, a pattern may be formed by forming a metal film that reflects the laser beam, or the like over the cap film 103, so that the laser beam reaches only a portion of the semiconductor film, where crystals in which orientation of crystal planes is controlled are formed.

Further, in order to utilize the laser beam emitted from the laser oscillators 11a and 11b more efficiently, the energy in a length direction of the beam spot may be uniformly distributed by using a beam homogenizer such as a lens array or a diffractive optical element. Further, the Y-axis one-axis robot 21 is moved by a distance equal to the width of the crystalline semiconductor film that is formed, and the X-axis one-axis robot 20 is made to be scanned at a predetermined speed. By repeating a series of such operations, the entire surface of the semiconductor film can be efficiently crystallized.

Next, an experimental example is described with reference to drawings, in which a crystalline region in which crystal planes in a direction perpendicular to the surface (a viewing plane A) are orientated along {001}, a crystalline region in which crystal plane are orientated along {211}, and a crystalline region in which crystal plane are orientated along {101} are formed using the above optical system.

First, a sample is described. As an insulating film serving as a base film, a $SiN_xO_y$ (x>y) film with a thickness of 50 nm is formed by a plasma CVD method and then, a $SiN_xO_y$ (x<y) film with a thickness of 100 nm is formed by a plasma CVD method over a substrate. Then, an amorphous silicon film with a thickness of 66 nm is formed over the insulating film by a plasma CVD method.

After the amorphous silicon film is formed, heat treatment for extracting hydrogen from the amorphous semiconductor film is performed, and a cap film is formed over the semiconductor film. As the cap film, for example, a $SiN_xO_y$ (x<y) film with a thickness of 500 m is formed. As the etching rate of this film, when the cap film is etched typically using a mixture solution containing ammonium hydrogen fluoride and ammonium fluoride (manufactured by Stella Chemifa Corporation, product name: LAL 500) at 20° C., the etching rate is greater than or equal to 1 nm/min and less than or equal to 150 nm/min, preferably, greater than or equal to 10 nm/min and less than or equal to 130 nm/min, and further preferably, greater than or equal to 10 nm/min and less than or equal to 100 nm/min. The etching rate of etching using a hydrofluorocarbon gas is greater than or equal to 100 nm/min and less than or equal to 150 nm/min, and preferably greater than or equal to 110 nm/min and less than or equal to 130 nm/min. The $SiN_xO_y$ (x<y) as the cap film is formed by a plasma CVD method using monosilane ($SiH_4$), ammonium ($NH_3$), and nitrous oxide ($N_2O$) as a reaction gas.

Further, as the cap film, $SiN_xO_y$ (x>y) with a thickness of 400 nm may be formed by a plasma CVD method using monosilane ($SiH_4$) and ammonium ($NH_3$) as a reaction gas.

After that, the amorphous silicon film is irradiated with a continuous wave laser beam or a pulsed laser beam with repetition rate of 10 MHz or more through the cap film. An experimental result at that time is shown in FIG. 4, which shows relation among the scanning speed x (cm/sec) and power y (W) of the laser beam, and orientation of crystal planes in the viewing plane A of a crystalline silicon film to be formed.

In FIG. 4, a horizontal axis indicates the scanning speed of a laser beam, and a vertical axis indicates the power of a laser beam. In the Gaussian distribution of a laser beam at this time, a portion where the energy distribution is uneven is removed by slit, and an area of the beam spot is 500 μm×20 μm.

In a region 141 of FIG. 4, a crystalline semiconductor film including large grain crystals, in which crystal planes of the viewing plane A are orientated along {001}, can be formed.

In a region 142, the crystalline semiconductor film including large grain crystals, in which crystal planes of the viewing plane A are orientated along {211}, can be formed.

In a region 143, the crystalline semiconductor film including large grain crystals, in which crystal planes of the viewing plane A are orientated along {101}, can be formed.

In a region 144, the crystalline semiconductor film including small grain crystal can be formed.

In a region 145, the crystalline semiconductor film is partially evaporated.

In a region 146, the crystalline semiconductor film including large grain crystals, in which orientation of crystal planes is random can be formed. In such a region, since excess energy that is more than that necessary for forming large grain crystals is supplied to the semiconductor film, a plurality of turbulent flows are generated, so that orientation of crystal planes is random.

In FIG. 4, the range (region 141) of power and scanning speed of the laser beam, where crystals in which crystal planes are orientated along {001} can be formed in the viewing plane A, is located above the range of power and scanning speed of the laser beam in which the crystalline semiconductor including small grain crystals is formed; and located below the range of power and scanning speed of the laser beam where crystals in which crystal planes are orientated along {211} are not formed in the viewing plane A.

In other words, at the scanning speed of the laser beam of 10 cm/sec or more and less than 20 cm/sec, the region 141 is within a range of the scanning speed x and the power y of the laser beam which satisfies Formula 1 or more and less than Formula 2. Formula 1 indicates a relation between power and scanning speed of the laser beam by which crystals in which crystal planes are orientated along {001} can be formed in the viewing plane A. Formula 2 indicates a relation between power and scanning speed of the laser beam by which crystals in which crystal planes are orientated along {211} are not formed in the viewing plane A. Further, at the scanning speed of 20 cm/sec or more and less than 35 cm/sec, the region 141 is within a range of the scanning speed x and the power y of the laser beam which satisfies Formula 1 or more and less than Formula 3. Formula 3 indicates a relation between power and scanning speed of the laser beam by which crystals in which crystal planes are orientated along {211} are not formed in the viewing plane A.

$$y=0.0012x^2+0.083x+4.4 \quad \text{(Formula 1)}$$

$$y=0.28x+4.2 \quad \text{(Formula 2)}$$

$$y=-0.0683x+11.167 \quad \text{(Formula 3)}$$

The range (region 142) of power and scanning speed of the laser beam, where crystals in which crystal planes are orientated along {211} can be formed in the viewing plane A, is located above the range of power and scanning speed of the laser beam where the crystalline semiconductor including small grain crystals is formed; located above the rage of power and scanning speed of the laser beam where crystals in which crystal planes are orientated along {001} are formed in the viewing plane A; and located below the range of power and scanning speed of the laser beam where the crystalline semiconductor film is partially evaporated; or located below the range of power and scanning speed of the laser beam where the crystalline semiconductor film including large grain crystals in which orientation of crystal planes is random is formed.

In other words, at the scanning speed of 10 cm/sec or more and less than 20 cm/sec, the region 142 is within a range of the scanning speed x and the power y of the laser beam which satisfies Formula 2 or more and less than Formula 4. Formula 4 indicates a relation of power of a laser beam by which crystals in which crystal planes are orientated along {211} can be formed in the viewing plane A. Further, at the scanning speed of 20 cm/sec or more and less than 35 cm/sec, the region 142 is within a range of the scanning speed x and the power y of the laser beam which satisfies Formula 3 or more and less than Formula 4. Furthermore, at the scanning speed of 35 cm/sec or more and less than 55 cm/sec, the region 142 is within a range of the scanning speed x and the power y of the laser beam which satisfies Formula 1 or more and less than Formula 5. Formula 5 indicates a relation of a power of a laser beam by which crystals in which crystal planes are orientated along {211} can be formed in the viewing plane A.

$$y=0.0027x+0.36x+4.2 \quad \text{(Formula 4)}$$

$$y=-0.37x+33 \quad \text{(Formula 2)}$$

The range (region 143) of power and scanning speed of the laser beam, where crystals in which crystal planes are orientated along {101} can be formed in the viewing plane A, is located above the range of power and scanning speed of the laser beam in which the crystalline semiconductor including small grain crystals is formed; and located below the range of power and scanning speed of the laser beam in which the crystalline semiconductor film is partially evaporated; or located below the range of power and scanning speed of the laser beam where the crystalline semiconductor film including large grain crystals in which orientation of crystal planes is random is formed.

In other words, at the scanning speed of 70 cm/sec or more and less than 90 cm/sec, the region 143 is within a range of Formula 1 or more and less than the conditions where the crystalline semiconductor film is partially evaporated, or within a range of the scanning speed x and the power y of the laser beam where the crystalline semiconductor film includes large grain crystals in which orientation of crystal planes is random.

By irradiating the amorphous silicon film with the laser beam with the above power and scanning speed selectively, a crystalline region in which crystal planes are orientated along {001}, a crystalline region in which crystal planes are orientated along {211}, and a crystalline region in which crystal planes are orientated along {101} can be selectively formed.

The crystalline region in which crystal planes are orientated along {001} in the viewing plane A is orientation of crystal planes which does not interfere with movement of electrons. The crystalline region in which crystal planes are orientated along {211} or {101} in the viewing plane A is orientation of crystal planes which does not interfere with movement of holes. Therefore, an n-channel thin film transistor is formed using the crystalline region in which crystal planes are orientated along {001} in the viewing plane A, and a p-channel thin film transistor is formed using the crystalline region in which crystal planes are orientated along {211} or {101} in the viewing plane A, whereby a semiconductor device in which mobility of each thin film transistor is improved can be manufactured.

Note that formation of the cap film makes an optical absorption coefficient of the semiconductor film to be changed due to interference effect of a multilayer film, and naturally, the optical absorption coefficient is changed depending on the thickness of the cap film. It is known that a semiconductor film in a solid state and a semiconductor film in a melted state have different optical absorption coefficients from each other, and the smaller a difference between the optical absorption coefficients is, the wider a laser power margin of lateral crystal growth becomes. That is, in a case where an absorption coefficient is increased suddenly at the moment of melting the semiconductor film by irradiating the solid semiconductor film with a laser beam, the semiconductor film becomes easy to be ablated. Accordingly, it is needless to say that the laser power in FIG. 4 is relatively changed depending on the thicknesses of the semiconductor film and the cap film.

Next, orientation of crystal planes in the crystalline semiconductor film formed in this embodiment mode is described. This embodiment mode shows results of EBSP (Electron Back Scatter Diffraction Pattern) measurement which represents orientation of crystal planes in the crystalline semiconductor film after the cap film thereover is removed by an etching step.

Orientation of crystal planes within a crystal cannot be determined by only the orientation of crystal planes from measurement of one viewing plane in the crystal. That is because, even if orientation of crystal planes in one viewing plane is aligned in one direction, orientation of crystal planes within the crystal is not considered to be aligned in a case where orientation of crystal planes in the other viewing planes is not aligned. Therefore, when more information on orientation of crystal planes is obtained from at least two planes or from many planes, higher accuracy of orientation of crystal planes within the crystal is obtained. In other words, when distribution of orientation of crystal planes of all three planes is uniform in the measurement region, the crystal can be regarded as an approximately single crystal.

FIGS. 5A to 5F show orientation of crystal planes in a crystalline semiconductor film including large grain crystals and formed under the laser irradiation condition of the region 141 (laser power: 8.4 W, scanning speed: 20 cm/sec). FIG. 5A shows distribution of orientation of crystal planes in a measurement region that is perpendicular to the surface of the crystalline semiconductor film. FIG. 5D shows distribution of the orientation ratio of orientation of crystal planes in the same direction with FIG. 5A, in which red portions (portion of R in the drawing) have highest frequency, and blue portions (portion of B in the drawing) have lowest frequency. It is found that crystal planes in the perpendicular direction to the surface are orientated along {001} because the portion of {001} is red.

Similarly, FIG. 5B shows distribution of orientation of crystal planes in a measurement region in the direction that is parallel to the surface of the crystalline semiconductor film and that is perpendicular to the scanning direction of a laser beam. FIG. 5E shows distribution of orientation ratio of the orientation of crystal planes in the same direction with FIG. 5B. FIG. 5C shows distribution of orientation of crystal planes in a measurement region in the direction that is parallel to the surface of the crystalline semiconductor film and that is parallel to the scanning direction of the laser beam, and FIG. 5F shows distribution of orientation ratio of the orientation of crystal planes in the same direction. From FIGS. 5B, 5C, 5E, 5F, in both of the direction that is parallel to the surface of the crystalline semiconductor film and that is perpendicular to the scanning direction of the laser beam; and the direction that is parallel to the surface of the crystalline semiconductor film and that is parallel to the scanning direction of the laser beam, crystal planes are orientated along {x01}. It is noticed that each measurement region is occupied by crystals in which crystal planes are orientated in one direction at the rate of greater than or equal to 40% and less than or equal to 100%, preferably, greater than or equal to 60% and less than or equal to 100%.

Note that the orientation of crystal planes {x01} (x=0, 1, 2, 3) indicates the total amount of orientation ratios of orientation of crystal planes {001}, {301}, {201}, and {101}.

Figure 6A:
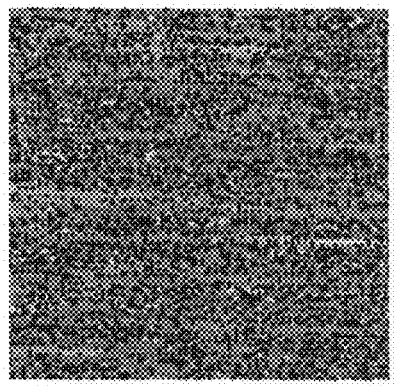
FIGS. 6A to 6F are diagrams each showing an observation result of a sample in Embodiment Mode 2 of the present invention.
Figure 6B:
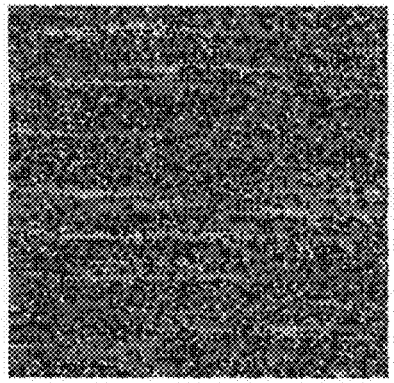
Figure 6C:
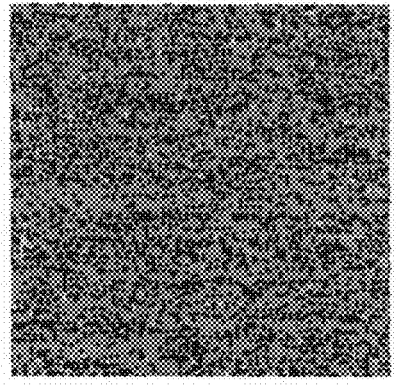
Figure 6D:
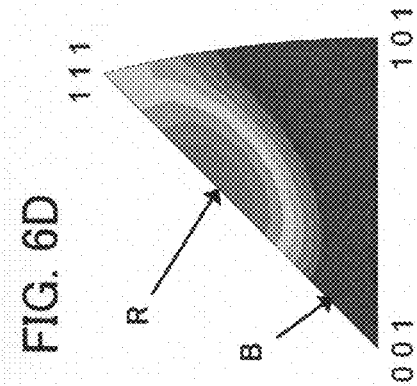
Figure 6E:
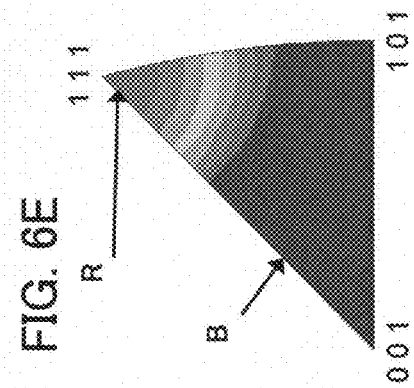
Figure 6F:
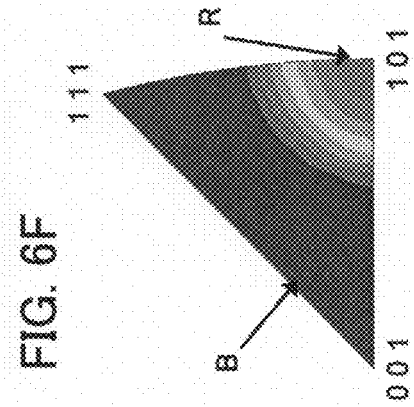

FIGS. 6A to 6F show orientation of crystal planes in a crystalline semiconductor film including large grain crystals and formed under the laser irradiation condition of the region 142 (laser power: 10.8 W, scanning speed: 20 cm/sec). FIG. 6A shows distribution of orientation of crystal planes in a measurement region in perpendicular direction to the surface of the crystalline semiconductor film, and FIG. 6D shows distribution of orientation ratio of orientation of crystal planes in the same direction with FIG. 6A. Similarly, FIG. 6B shows distribution of orientation of crystal planes in a measurement region in the direction that is parallel to the surface of the crystalline semiconductor film and that is perpendicular to the scanning direction of the laser beam. FIG. 6E shows distribution of orientation ratio of orientation of crystal planes in the same direction with the FIG. 6B. FIG. 6C shows distribution of orientation of crystal planes in a measurement region in the direction that is parallel to the surface of the crystalline semiconductor film and that is parallel to the scanning direction of the laser beam. FIG. 6F shows distribution of orientation ratio of orientation of crystal planes in the same direction of FIG. 6C. A way to interpret each drawing is similar to those of FIGS. 5A to 5F.

From FIGS. 6A and 6D, it is found that in the perpendicular direction to the surface of the crystalline semiconductor film, crystal planes are orientated along {211}. From FIGS. 6B and 6E, it is found that in the direction that is parallel to the surface of the crystalline semiconductor film and that is perpendicular to the scanning direction of the laser beam, crystal planes are orientated along {111}. From FIGS. 6C and 6F, it is found that in the direction that is parallel to the surface of the crystalline semiconductor film and that is parallel to the scanning direction of the laser beam, crystal planes are orientated along {101}. Each measurement region is occupied by crystals in which crystal planes are orientated in one direction at the rate of greater than or equal to 40% and less than or equal to 100%, preferably, greater than or equal to 60% and less than or equal to 100%.

Figure 7A:
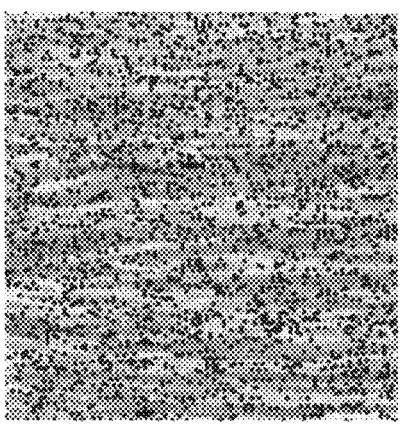
FIGS. 7A to 7F are diagrams each showing an observation result of a sample in Embodiment Mode 2 of the present invention.
Figure 7B:
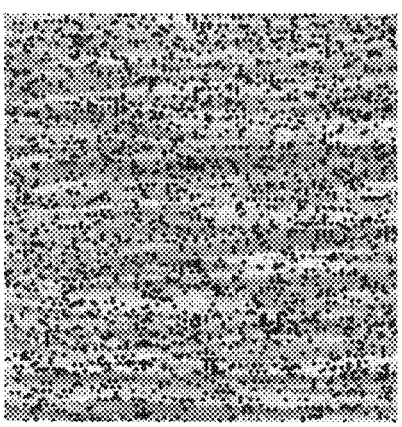
Figure 7C:
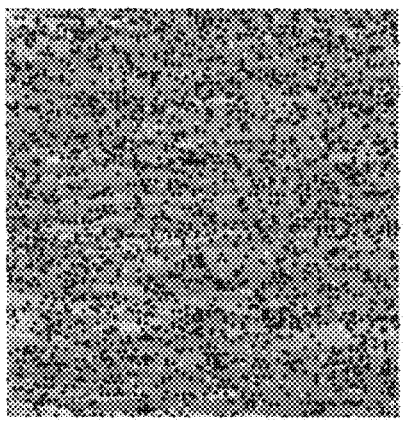
Figure 7D:
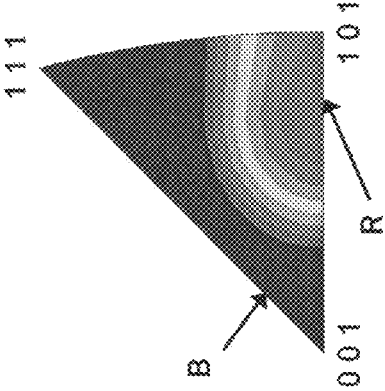
Figure 7E:
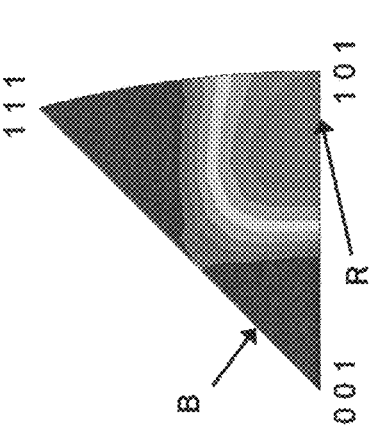
Figure 7F:
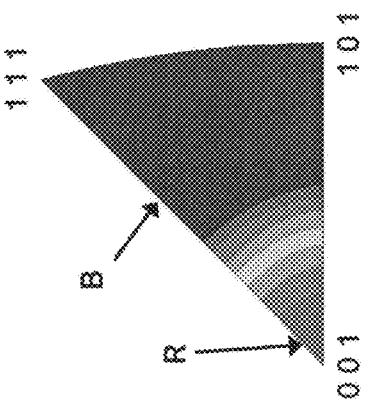

FIGS. 7A to 7F show orientation of crystal planes in a crystalline semiconductor film including large grain crystals and formed under the laser irradiation condition of the region 143 (laser power: 28 W, scanning speed: 90 cm/sec). FIG. 7A shows distribution of orientation of crystal planes in a measurement region in the perpendicular direction to the surface of the crystalline semiconductor film, and FIG. 7D shows distribution of the orientation ratio of orientation of crystal planes in the same direction. Similarly, FIG. 7B shows distribution of orientation of crystal planes in a measurement region in the direction that is parallel to the surface of the crystalline semiconductor film and that is perpendicular to the scanning direction of the laser beam. FIG. 7E shows distribution of orientation ratio of orientation of crystal planes in the same direction with FIG. 7B. FIG. 7C shows distribution of orientation of crystal planes in a measurement region in the direction that is parallel to the surface of the crystalline semiconductor film and that is parallel to the scanning direction of the laser beam. FIG. 7F shows distribution of the orientation ratio of orientation of crystal planes in the same direction with FIG. 7C. A way to interpret each diagram is similar to those of FIGS. 5A to 5F.

From FIGS. 7A and 7D, it is found that the crystal planes in the perpendicular direction to the surface of the crystalline semiconductor film are orientated along {101}. From FIGS. 7B and 7E, it is found that in the direction that is parallel to the surface of the crystalline semiconductor film and that is perpendicular to the scanning direction of the laser beam, crystal planes are orientated along {101}. From FIGS. 7C and 7F, it is found that in the direction that is parallel to the surface of the crystalline semiconductor film and that is parallel to the scanning direction of the laser beam, crystal planes are orientated along {001}. Each measurement region is occupied by crystals in which crystal planes are orientated in one direction at the rate of greater than or equal to 40% and less than or equal to 100%, preferably, greater than or equal to 60% and less than or equal to 100%.

As described above, the semiconductor film over which the cap film is formed is irradiated with a CW laser or a pseudo CW laser, and crystals are grown laterally, so that a crystalline semiconductor film including large grain crystals, in which crystal planes are orientated in one direction, can be formed.

Further, orientation of crystal planes can be controlled optionally in the crystalline semiconductor film that can be formed by control of the laser irradiation condition. Therefore, in a case where a silicide film is formed, an optimal silicide film can be obtained depending on metal used for silicide, and a semiconductor device with high performance can be manufactured.

Furthermore, the cap film is formed and the crystals are grown laterally, whereby a crystalline semiconductor film, of a surface which is extremely planarized, can be formed. Therefore, by using this crystalline semiconductor film, for example, for a channel region and source and drain regions of a thin film transistor, a semiconductor device with the small amount of a leak current and high withstand voltage can be manufactured.

Embodiment Mode 3

This embodiment mode will describe a method for manufacturing a crystalline semiconductor film in which crystal planes in the perpendicular direction to the surface are orientated along {111} with reference to drawings. In this embodiment mode, a cap film is formed over an amorphous semiconductor film, and the amorphous semiconductor film is irradiated with a continuous wave laser beam or a pulsed laser beam with repetition rate of 10 MHz or more through the cap film, so that the crystalline semiconductor film is formed. A sample to be crystallized which is same as that of Embodiment Mode 2 is used.

Figure 8:
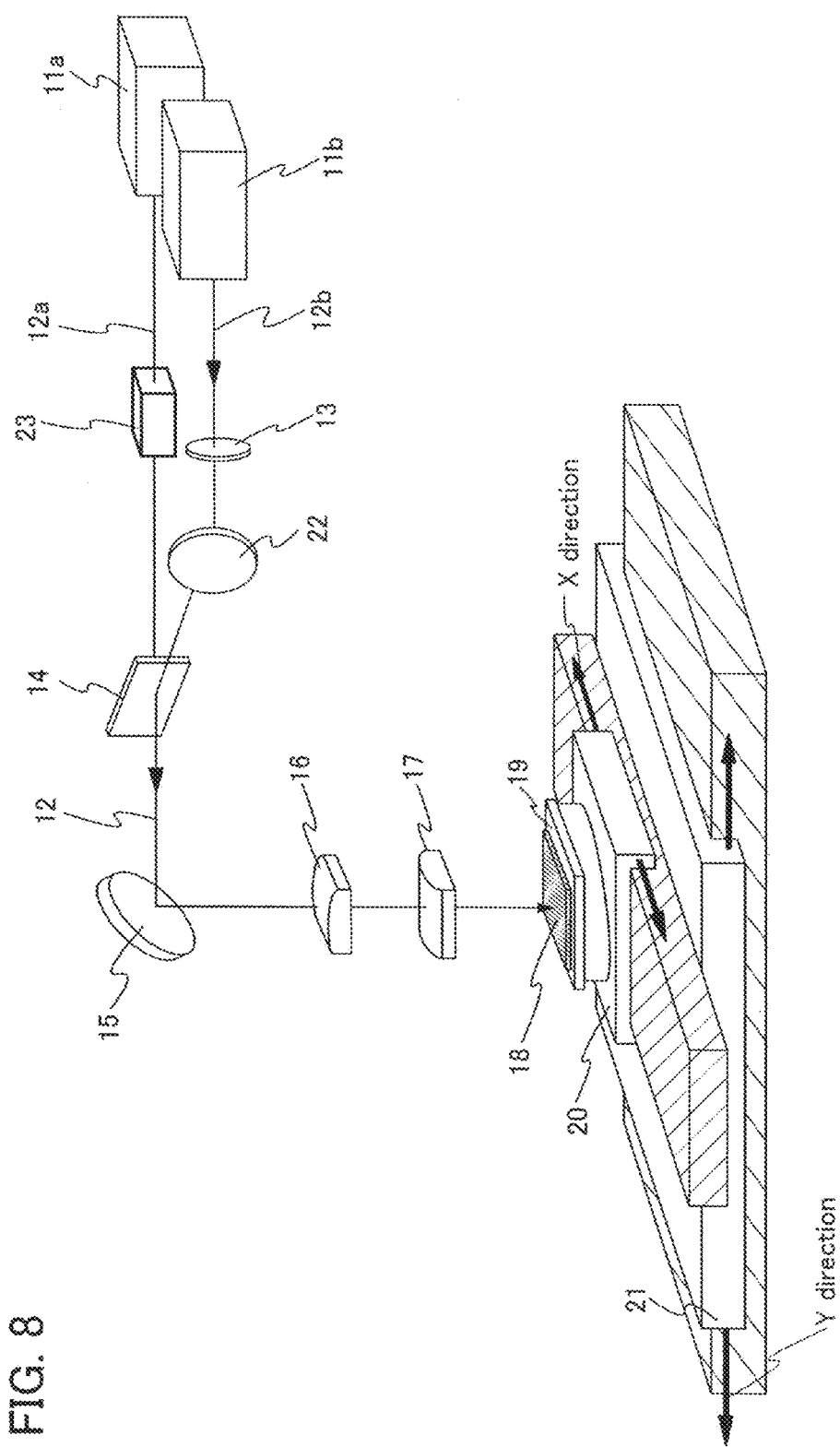
FIG. 8 is a diagram showing an optical device used for manufacture of a crystalline semiconductor film in Embodiment Mode 3 of the present invention.

FIG. 8 shows an optical system for laser irradiation used in this embodiment mode. An optical system used in this embodiment mode is same as the optical system used in Embodiment Mode 2 except that a beam expander 23 is inserted between the optical laser oscillator 11a and the polarizer 14 used in Embodiment Mode 2; therefore, the explanation of the same portions is omitted.

In FIG. 8, a laser beam 12a emitted from the laser oscillator 11a enters the beam expander 23. Although the laser beam emitted from the beam expander is usually adjusted to be parallel light, in this embodiment mode, the laser beam emitted from the beam expander 23 is adjusted to be emitted with a divergence angle.

A laser beam 12b emitted from the laser oscillator 11b becomes a linear beam with a high aspect ratio on a surface to be irradiated similar to Embodiment Mode 1 because the laser beam 12b passes through the same optical element as the optical system of Embodiment Mode 2. On the other hand, the laser beam 12a emitted from the laser oscillator 11a becomes a linear beam with a low aspect ratio on the surface to be irradiated because the laser beam 12a passes through the same optical element as the optical system of Embodiment Mode 1 after passing trough the beam expander 23.

Figure 9A:
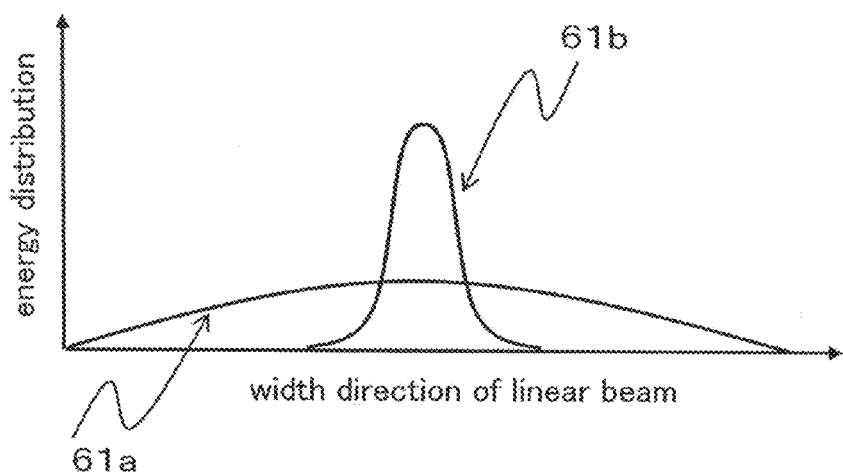
FIGS. 9A and 9B are diagrams showing energy distribution of a laser beam used for manufacture of a crystalline semiconductor film in Embodiment Mode 3 of the present invention.
Figure 9B:
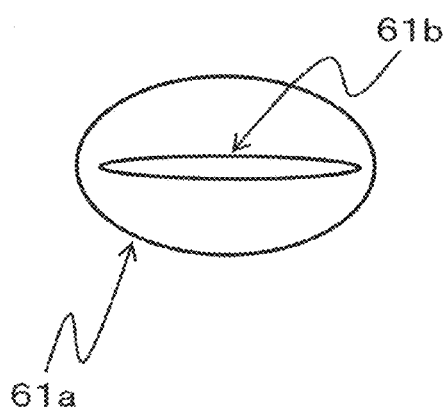

Energy distribution of the laser beam on the surface to be irradiated is shown in FIGS. 9A and 9B. FIG. 9A is a diagram showing energy distribution in the linear beam directions, and FIG. 9B is a plane view of the beam shapes. In FIGS. 9A and 9B, reference numeral 61a denotes energy distribution on the surface to be irradiated with the laser beam 12a emitted from the laser oscillator 11a, and reference numeral 61b denotes energy distribution on the surface to be irradiated with the laser beam 12b emitted from the laser oscillator 11b.

In a case where such a linear beam in which the linear beam 61b and the linear beam 61a are combined is used for irradiation, it becomes possible to extend time for keeping the semiconductor film in a melted state, as compared with the case of irradiation with only the linear beam 61b. Accordingly, a crystalline semiconductor film can be formed, in which orientation of crystal planes is different from that in a crystalline semiconductor film formed by irradiation with only the linear beam 61b.

Next, orientation of crystal planes in the crystalline semiconductor film formed in this embodiment mode is described. This embodiment mode show results of EBSP (electron back scatter diffraction pattern) measurement in FIGS. 10A to 10F which represents orientation of crystal planes in a crystalline semiconductor film after a cap film thereover is removed by an etching step. Power of laser emitted from the laser oscillator 11a is 10 W, and power of laser emitted from the laser oscillator 11b is 13 W. The scanning speed is 75 cm/sec.

Figure 10C:
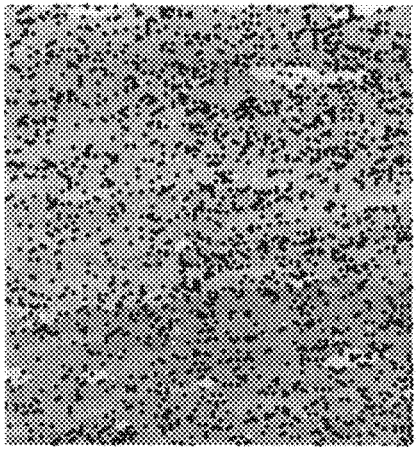
FIGS. 10A to 10F are diagrams showing an observation result of a sample in Embodiment Mode 3 of the present invention.
Figure 10B:
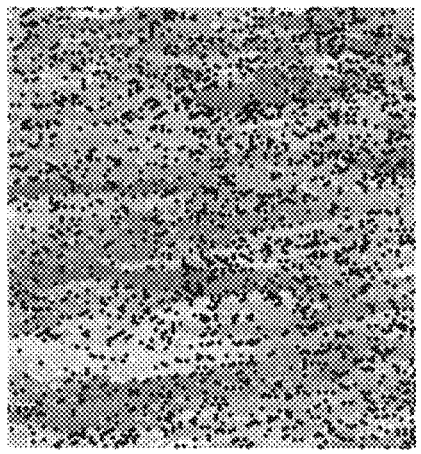
Figure 10A:
Figure 10F:
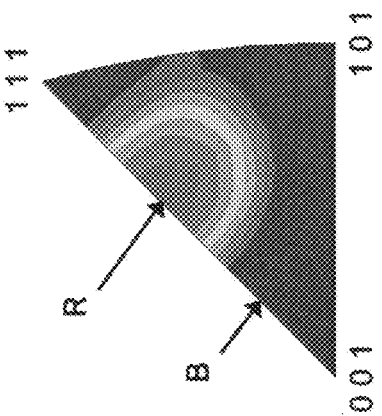
Figure 10E:
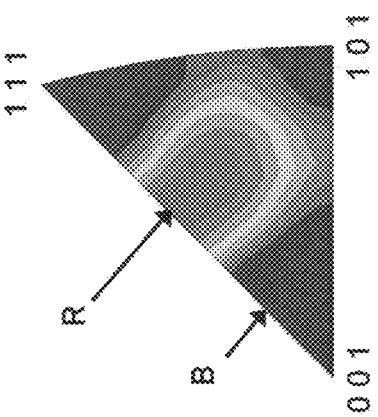
Figure 10D:
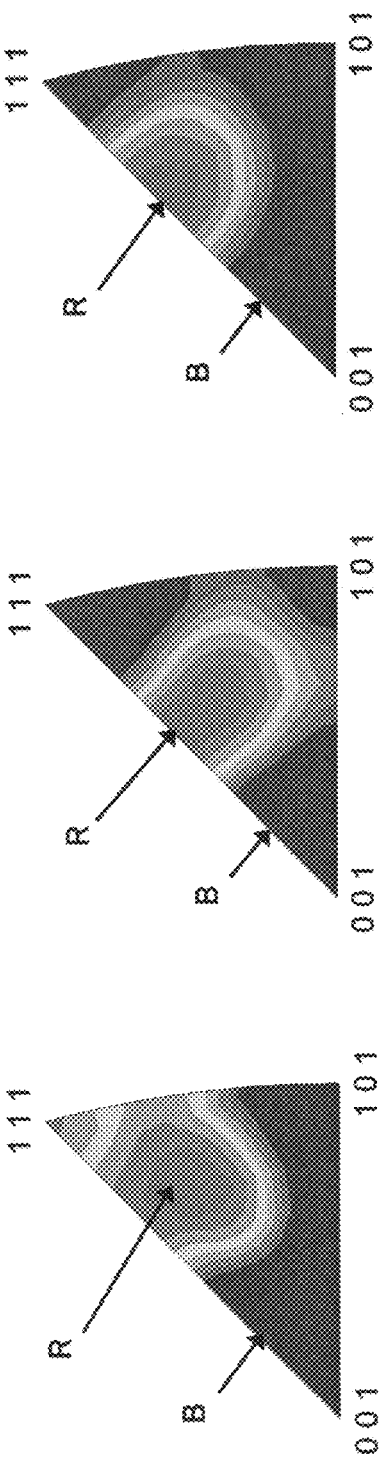

FIG. 10A shows distribution of orientation of crystal planes in a measurement region in the perpendicular direction to the surface of the crystalline semiconductor film, and FIG. 10D shows distribution of orientation ratio of orientation of crystal planes in the same direction. Similarly, FIG. 10B shows distribution of orientation of crystal planes in a measurement region in the direction that is parallel to the surface of the crystalline semiconductor film and that is perpendicular to the scanning direction of the laser beam. FIG. 10E shows distribution of orientation ratio of orientation of crystal planes in the same direction with FIG. 10B. FIG. 10C shows distribution of orientation of crystal planes in a measurement region in the direction that is parallel to the surface of the crystalline semiconductor film and that is parallel to the scanning direction of the laser beam. FIG. 10F shows distribution of orientation ratio of orientation of crystal planes in the same direction with the FIG. 10C. A way to interpret each diagram is similar to those of FIGS. 5A to 5F.

From FIGS. 10A and 10B, it is found that crystal planes in the perpendicular direction to the surface of the crystalline semiconductor film are orientated along approximately {111}. From FIGS. 10B and 10E, it is found that in the direction that is parallel to the surface of the crystalline semiconductor film and that is perpendicular to the scanning direction of the laser beam, crystal planes are orientated along {211}. From FIGS. 10C and 10F, it is found that in the direction that is parallel to the surface of the crystalline semiconductor film and that is parallel to the scanning direction of the laser beam, crystal planes are orientated along {211}. Each measurement region is occupied by crystals in which crystal planes are orientated in one direction at the rate of greater than or equal to 40% and less than or equal to 100%, preferably, greater than or equal to 60% and less than or equal to 100%.

As described above, the semiconductor film over which the cap film is formed is irradiated with a CW laser or a pseudo CW laser and crystals are grown laterally, so that a crystalline semiconductor film including large grain crystals, in which orientation of crystal planes are controlled in one direction, can be formed.

Further, orientation of crystal planes can be optionally controlled in a crystalline semiconductor film that can be formed by control of the laser irradiation condition. Therefore, in a case where a silicide film is formed, an optimal silicide film can be obtained depending on metal used for silicide, and a semiconductor device with higher performance can be manufactured.

Furthermore, the cap film is formed and crystals are grown laterally, whereby a crystalline semiconductor film, of a surface which is extremely planarized, can be formed. Thus, when this crystalline semiconductor film is used, for example, for a channel region and source and drain region of a thin film transistor, a semiconductor device with small leak current and high withstand voltage can be manufactured.

Embodiment 1

This embodiment will describe an example of a method for manufacturing an active matrix substrate using the semiconductor film of a manufacturing method which is shown in the embodiment modes of the present invention, with reference to drawings. FIGS. 11A to 14C are process diagrams of a method for manufacturing an active matrix substrate in this embodiment.

In FIG. 11A, a substrate 700 is made of glass such as barium borosilicate glass or aluminoborosilicate glass typified by #7059 glass or #1737 glass manufactured by Corning, Inc. Note that the substrate 700 may be a quartz substrate, silicon substrate, a metal substrate, or a stainless substrate having a surface provided with an insulating film. Furthermore, a plastic substrate which can withstand the processing temperature of this embodiment may be used.

Next, a base film 701 formed of an insulating film such as a silicon oxide film, a silicon nitride film, or a silicon oxynitride film is formed over the substrate 700. Although the base film 701 has a two-layer structure in this embodiment, the insulating film may be a single film or have a stacked structure with two or more layers. As a first layer of the base film 701, a silicon oxynitride film 701a is formed to have a thickness of 10 to 200 nm (preferably, 50 to 100 nm), using $SiH_4$, $NH_3$, and $N_2O$ as reaction gases by a plasma CVD method. In this embodiment, a silicon oxynitride film 701a with a thickness of 50 nm (composition ratio: Si=32%, O=27%, N=24%, H=17%) is formed. Then, as a second layer of the base film 701, a silicon oxynitride film 701b is formed to have a thickness of 50 to 200 nm (preferably, 100 to 150 nm), using $SiH_4$ and $N_2O$ as reaction gases by a plasma CVD method. In this embodiment, a silicon oxynitride film 701b with a thickness of 100 nm (composition ratio: Si=32%, O=59%, N=7%, H=2%) is formed.

Next, a semiconductor film 702 is formed over the base film 701. The semiconductor film 702 is formed to have an amorphous structure with a thickness of 20 to 80 nm by a known method (such as a sputtering method, an LPCVD method, or a plasma CVD method). A material of the semiconductor film is not limited, and the semiconductor film is preferably formed using silicon or a silicon germanium (SiGe) alloy. In this embodiment, an amorphous silicon film with a thickness of 30 nm is formed by a plasma CVD method.

Then, a cap film 703 is formed over the semiconductor film 702. As the cap film 703, SiON is deposited to have a thickness of 300 nm by a plasma CVD method.

Then, as shown in FIG. 11B, the semiconductor film 702 is crystallized to form a crystalline semiconductor film 801, and then, the cap film 703 is removed by a method for manufacturing a crystalline semiconductor film shown in Embodiment Modes 1 to 3.

Next, as shown in FIG. 11C, the crystalline semiconductor film 801 that is obtained by a laser crystallization method is patterned into a desired shape, thereby forming semiconductor layers 802 to 806.

After formation of the semiconductor layers 802 to 806, doping of a minute amount of impurity elements (boron or phosphorus) may be performed in order to control the threshold value of TFTs.

Next, a gate insulating film 807 with which the semiconductor layers 802 to 806 are covered is formed. The gate insulating film 807 is formed using an insulating film containing silicon with a thickness of 40 to 150 nm by a plasma CVD method or a sputtering method. In this embodiment, a silicon oxynitride film (composition ratio: Si=32%, O=59%, N=7%, H=2%) with a thickness of 110 nm is formed by a plasma CVD method. Naturally, the gate insulating film is not limited to a silicon oxynitride film, and the gate insulating film may be another insulating film containing silicon of a single layer or a stacked structure.

In the case of using a silicon oxide film, TEOS (tetraethyl Orthosilicate) and $O_2$ are mixed by a plasma CVD method, and discharge is performed under conditions where a reaction pressure is 40 Pa, a substrate temperature is 300 to 400° C., and a high frequency (13.56 MHz) power density is 0.5 to 0.8 W/cm², so that the silicon oxide film can be formed. The silicon oxide film manufactured in such a manner can obtain favorable characteristics as the gate insulating film by thermal annealing of 400 to 500° C. afterward.

Next, a first conductive film 808 with a thickness of 20 to 100 nm and a second conductive film 809 with a thickness of 100 to 400 nm are stacked over the gate insulating film 807. In this embodiment, a first conductive film 808 formed of a tantalum nitride film with a thickness of 30 nm and a second conductive film 809 formed of a W film with a thickness of 370 nm are stacked. The tantalum nitride film is formed by a sputtering method using Ta as a target in an atmosphere containing nitrogen. The W film is formed by a sputtering method using W as a target. Further, the W film can be formed by a thermal CVD method using tungsten hexafluoride ($WF_6$). In any case, it is necessary that resistance is to be lowered for using the first and second conductive films as a gate electrode, and resistivity of the W film is desirably set to be 20 μΩcm or less. In the W film, resistivity can be attempted to be lowered by increasing sizes of crystal grains; however, when the large amount of impurity elements such as oxygen are included in the W film, the crystallization is inhibited, and resistivity is increased. Accordingly, in this embodiment, the W film is formed by a sputtering method using W with high purity (purity of 99.9999%) as a target and by sufficiently considering that impurities are not entered from a vapor phase in deposition, so that resistivity of 9 to 20 μΩcm could be achieved.

Although the first conductive film 808 is tantalum nitride and the second conductive film 809 is W in this embodiment, materials of the first and second conductive films are not particularly limited, and each of the conductive films may be formed using an element selected from Ta, W, Ti, Mo, Al, Cu, Cr, or Nd, or an alloy material or a compound material containing an element as listed above as its main component. Further, a semiconductor film may be used, which is typified by a crystalline silicon film doped with an impurity element such as phosphorus. An AgPdCu alloy may be used. Furthermore, the following combinations of films may be employed: a combination of a tantalum (Ta) film as the first conductive film and a W film as a second conductive film; a combination of a titanium nitride film as the first conductive film and a W film of the second conductive film; a combination of a titanium nitride film as the first conductive film and a W film as the second conductive film; a combination of a tantalum nitride film as the first conductive film and an Al film as the second conductive film; or a combination of a tantalum nitride film as the first conductive film and a Cu film as the second conductive film.

Next, as shown in FIG. 11D, resist masks 810 to 815 are formed using a photolithography method, and first etching treatment for forming electrodes and wirings is performed. The first etching treatment is performed under first and second etching conditions. In this embodiment, an ICP (Inductively Coupled Plasma) etching method is used as the first etching condition. Etching is performed as follows: as etching gases, $CF_4$, $Cl_2$, and $O_2$ with gas flow rate of 25/25/10 (sccm), respectively, are used; and RF (13.56 MHz) power of 500 W is supplied to a coiled electrode with pressure of 1 Pa to generate plasma. Here, a dry etching device using ICP manufactured by Matsushita Electric Industrial Co., Ltd. (Model E645-square ICP) is used. RF (13.56 MHz) power of 150 W is supplied to a substrate side (sample stage), so that a negative self-bias voltage is applied. By this first etching condition, the W film is etched to form the first conductive layer whose end portion is a tapered shape.

After that, etching is performed for about 30 seconds under the second etching condition without removing the resist masks 810 to 815, in which as the etching gases, $CF_4$ and $Cl_2$ with gas flow rate of 30/30 (sccm), respectively are used, and RF (13.56 MHz) power of 500 W is supplied to a coiled electrode with pressure of 1 Pa to generate plasma. RF (13.56 MHz) power of 20 W is supplied to the substrate side (sample stage), and a negative self-bias is applied. In the second etching condition in which $CF_4$ and $Cl_2$ are mixed, both the W film and the tantalum nitride film are etched to the same extent. In order to perform etching so as not to leave residues on the gate insulating film, etching time is preferably increased by approximately 10 to 20%.

In the first etching treatment, by forming the resist masks into suitable shapes, end portions of the first and second conductive layers become tapered shapes due to effect of the bias voltage applied to the substrate side. The angle of the tapered portion is 15° to 45°. Thus, conductive layers 817 to 822 (first conductive layers 817a to 822a and second conductive layers 817b to 822b) in first shapes are formed of the first conductive layer and the second conductive layer by the first etching treatment. Reference numeral 816 denotes a gate insulating film, and regions which are not covered with the conductive layers 817 to 822 in first shapes are etched by approximately 20 to 50 nm to be thin.

Then, as shown in FIG. 12A, first doping treatment is performed without removing the resist masks, and an impurity element imparting n-type conductivity is added to the semiconductor layers. The doping treatment may be conducted by an ion doping method or an ion implanting method. An ion doping method is performed with the dose of $1\times10^{13}$ to $5\times10^{15}/cm^2$ at an accelerating voltage of 60 to 100 keV. In this embodiment, the dose is $1.5\times10^{15}/cm^2$, and the accelerating voltage is 80 keV. An element belonging to Group 15 of the periodic table, typically, phosphorus (P) or arsenic (As) is used as the impurity element imparting n-type conductivity, but phosphorus (P) is used here. In this case, the conductive layers 817 to 821 in the first shapes function as masks to the impurity element imparting n-type conductivity, and first high concentration impurity regions 706 to 710 are formed in a self-aligned manner. In the first high concentration impurity regions 706 to 710, the impurity element imparting n-type conductivity is added within a concentration range of $1\times10^{20}$ to $1\times10^{21}/cm^2$.

Next, second etching treatment is performed without removing the resist masks. Here, $CF_4$, $Cl_2$, and $O_2$ are used as etching gases, and the W film is etched as selected. At this time, second conductive layers 828b to 833b are formed by the second etching treatment. On the other hand, the first conductive layers 817a to 822a are hardly etched, so that conductive layers 828 to 833 in second shapes are formed.

After that, as shown in FIG. 12B, second doping treatment is performed without removing the resist masks. In this case, the dose is reduced as compared with that of the first doping treatment, and the impurity element imparting n-type conductivity is introduced at a high accelerating voltage of 70 to 120 keV. In this embodiment, the dose is $1.5\times10^{14}/cm^2$, and the accelerating voltage is 90 keV. In the second doping treatment, the conductive layers 828 to 833 in second shapes are used as masks, and the impurity element is introduced into the semiconductor layer below the second conductive layers 828b to 833b, so that high concentration impurity regions 823a to 827a and low concentration impurity regions 823b to 827b are formed.

After the resist masks are removed, resist masks 834a and 834b are newly formed, and third etching treatment is performed as shown in FIG. 12C. The etching treatment is performed for about 30 seconds as follows: $SF_6$ and $Cl_2$ are used as etching gases with gas flow rate of 50/10 (sccm), respectively; and RF (13.56 MHz) power of 500 W is supplied to a coiled electrode with a pressure of 1.3 Pa to generate plasma. RF (13.56 MHz) power of 10 W is supplied to the substrate side (sample stage), and a negative self-bias voltage is applied. Thus, tantalum nitride films of a p-channel TFT and TFTs in a pixel portion (pixel TFT) are etched by the third etching treatment, so that conductive layers 835 to 838 in third shapes are newly formed.

As shown in FIG. 13A, after the resist masks are removed, the conductive layers 828 and 830 in third shapes and the conductive layers 835 to 838 in second shapes are used as masks, and the gate insulating film 816 is removed as selected, so that insulating films 839 to 844 are formed.

Next, as shown in FIG. 13B, resist masks 845a to 845c are newly formed, and third doping treatment is performed. By the third doping treatment, an impurity element imparting opposite type conductivity to the above conductivity type is added to the semiconductor layers that are to be activation layers of the p-channel TFTs, so that impurity regions 846 and 847 are formed. The second conductive layers 835a and 838a are used as masks to the impurity element, and an impurity element imparting p-type conductivity is added, whereby impurity regions are formed in a self-aligned manner. In this embodiment, the impurity regions 846 and 847 are formed by an ion doping method using diborane ($B_2H_6$) (FIG. 13B). In the third doping treatment, the semiconductor layers included in n-channel TFTs are covered with the masks 845a to 845c. By the first doping treatment and the second doping treatment, the impurity regions 846 and 847 are doped with phosphorus with different concentrations from each other. However, the doping treatment is conducted so that each region can have a concentration of the impurity element imparting p-type conductivity of $2\times10^{20}$ to $2\times10^{21}/cm^3$, whereby there is no problem for serving the regions as a source region and a drain region of the p-channel TFT. In this embodiment, since the semiconductor layers to be activation layers of the p-channel TFTs are partially exposed, there is an advantage in that the impurity element (boron) is easily added.

Through the above steps, impurity regions are formed in each semiconductor layer.

Next, the resist masks 845a to 845c are removed, and a first interlayer insulating film 861 is formed. The first interlayer insulating film 861 is formed using an insulating film containing silicon with a thickness of 100 to 200 nm by a plasma CVD method or a sputtering method. In this embodiment, a silicon oxynitride film with a thickness of 150 nm is formed by a plasma CVD method. As a matter of course, the first interlayer insulating film 861 is not limited to the silicon oxynitride film, and may be another insulating film containing silicon of a single layer or a stacked structure.

Next, as shown in FIG. 13C, by heat treatment, recovery of crystalline of the semiconductor layers and activation of the impurity elements added to each semiconductor layer are performed. This heat treatment is conducted by a thermal annealing method using an annealing furnace. A thermal annealing method may be conducted in a nitrogen atmosphere in which the oxygen concentration is 1 ppm or less, preferably, 0.1 ppm or less, at 400 to 700° C., typically, 500 to 550° C. In this embodiment, activation of the impurity elements is performed by heat treatment at 550° C. for four hours. Other than a thermal annealing method, a laser annealing method or a rapid thermal annealing method (RTA method) can be applied. In the case of a laser annealing method, a method described in the embodiment modes of the present invention may be employed; however, ablation in the gate and the like may occur depending on the given energy density, and it is necessary to pay attention to the conditions.

Before the first interlayer insulating film 861 is formed, heat treatment may be performed. However, in a case where an used wiring material is weak to heat, activation treatment is preferably performed after an interlayer insulating film (an insulating film containing silicon as its main component, e.g., a silicon nitride film) is formed so as to protect a wiring and the like as this embodiment.

In addition, heat treatment is performed in an atmosphere containing hydrogen of 3 to 100% at 300 to 550° C. for 1 to 12 hours, whereby a step of hydrogenating the semiconductor layers is performed. In this embodiment, heat treatment is performed in a nitrogen atmosphere containing hydrogen of about 3% at 410° C. for one hour. This step is for terminating dangling bonds of the semiconductor layers by hydrogen contained in the interlayer insulating film. As another method of hydrogenation, plasma hydrogenation (using hydrogen excited by plasma) may also be performed.

In the case using a conventional laser annealing method as activation treatment, after the above hydrogenation is performed, the semiconductor layers are desirably irradiated with a laser beam such as an excimer laser or a YAG laser.

Figure 14A:
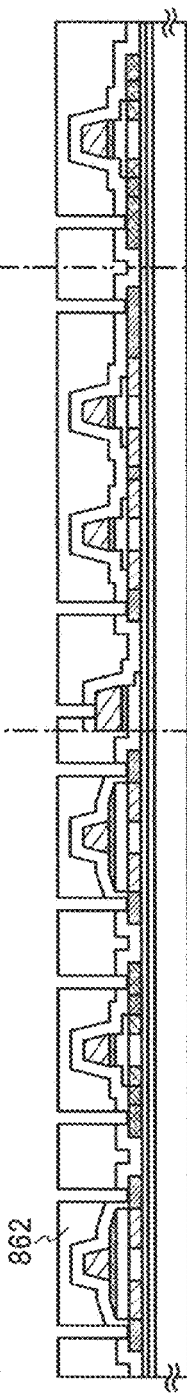
FIGS. 14A to 14C are cross-sectional views each illustrating a step of manufacturing an active matrix substrate in Embodiment 1 of the present invention.

Next, as shown in FIG. 14A, a second interlayer insulating film 862 is formed using an inorganic insulating material or an organic insulating material over the first interlayer insulating film 861. Contact holes for making contact with the electrodes are formed in the predetermined positions in the first interlayer insulating film 861 and the second interlayer insulating film 862 (on the source and drain regions). In this embodiment, an acrylic resin film with a thickness of 1.6 μm whose viscosity is 10 to 1000 cp, preferably, 40 to 200 cp, and surface has a depression and projection, is formed.

In this embodiment, in order to prevent specular reflection, the second interlayer insulating film whose surface has a depression and a projection is formed, whereby a depression and a projection are formed on a surface of a pixel electrode. In order to have a light scattering property by forming a depression and a projection on the surface of the pixel electrode, a projection may be formed in a region in a lower part of the pixel electrode. In that case, the projection can be formed using the same photomask as that in formation of the TFTs; therefore, the number of steps is not increased. Note that this projection may be provided, as appropriate, over the substrate in the pixel region other than the wiring and TFT portions. Thus, a depression and a projection are formed on the surface of the pixel electrode along with the depression and the projection formed on the surface of the insulating film with which the projection is covered.

Alternatively, a film for planarizing a surface may be used as the second interlayer insulating film 862. In that case, after the pixel electrode is formed, a depression and a projection are formed on a surface by adding a known step such as a sandblast method, an etching method, or the like, so that specular reflection is prevented and reflection light is scattered, whereby whiteness degree is preferably increased.

Figure 14B:
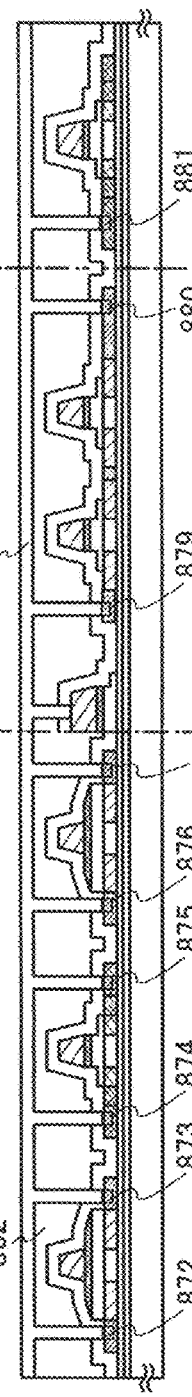

Next, as shown in FIG. 14B, the surface is washed with hydrofluoric acid similarly to Embodiment Mode 1; thereafter, a metal film 871 is formed with a thickness of 5 to 30 nm so as to cover the second high concentration impurity regions 823*a* to 827*a* exposed by a sputtering method. Then, heat treatment is performed. The metal film 871 here preferably contains Ni, Co, Pt, Pd, or Cr as its main component. By this step, silicide reaction is generated in portions where the second high concentration impurity regions 823*a* to 827*a* in the crystalline semiconductor film and the metal film are contacted, so that silicide films 872 to 877, and 879 to 881 are formed.

Next, unreacted metal is removed using a known etchant. By the step of forming the silicide film, resistivity of the source and drain regions can be sufficiently lowered. Accordingly, activation of the n-type impurity thereafter is unnecessary. It is needless to say that heat treatment, irradiation with intensity light, or irradiation with laser light can be performed for activation of the n-type impurity.

Figure 14C:
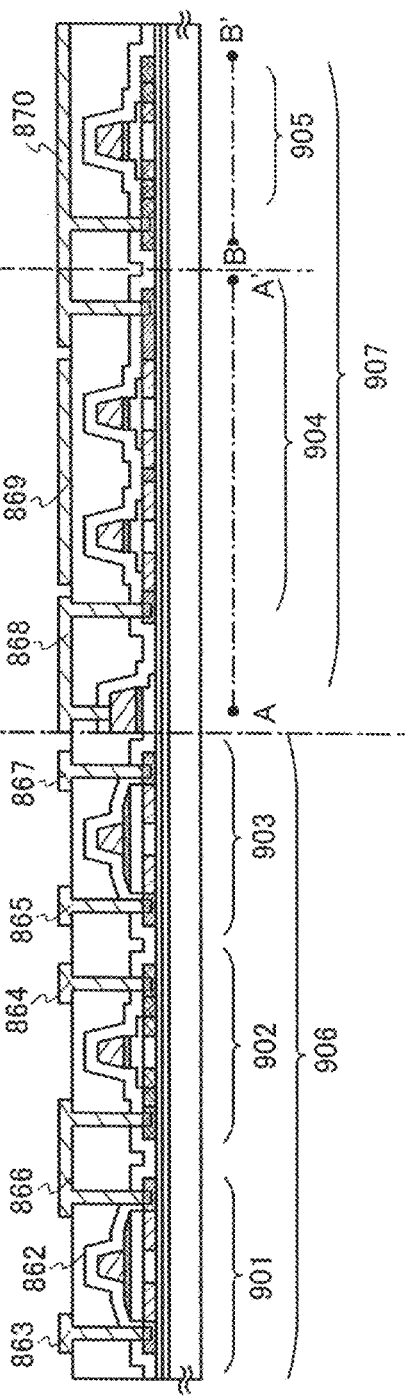

Then, as shown in FIG. 14C, in a driver circuit 906, wirings 863 to 867 each of which is electrically connected to each impurity region are formed. Theses wirings are formed by patterning a stacked film of a Ti film with a thickness of 50 nm and an alloy film (an alloy film of Al and Ti) with a thickness of 500 nm.

In a pixel portion 907, a pixel electrode 870, a gate wiring 869, and a connection electrode 868 are formed. With this connection electrode 868, a source wiring is electrically connected to the pixel TFT. The gate wiring 869 is electrically connected to a gate electrode of the pixel TFT. The pixel electrode 870 is electrically connected to a drain region of the pixel TFT. In addition, the pixel electrode 870 is electrically connected to the semiconductor layer functioning as one of electrodes included in a storage capacitor. As the pixel electrode 870, a film containing Al or Ag as its main component or a material having superiority in reflectivity such as a stacked film of Al or Ag is preferably used.

In such a manner, the driver circuit 906 comprising a CMOS circuit including an n-channel TFT 901 and a p-channel TFT 902, and an n-channel TFT 903; and a pixel portion 907 comprising a pixel TFT 904 and a storage capacitor 905 can be formed over the same substrate. Thus, an active matrix substrate is completed.

The n-channel TFT 901 of the driver circuit 906 has a channel formation region 823*c*, the low concentration impurity region 823*b* (GOLD region) overlapping with the first conductive layer 828*a* that is partially included in the gate electrode, and the second high concentration impurity region 823*a* functioning as a source or drain region. This n-channel TFT 901 is connected to the p-channel TFT 902 through the electrode 866, whereby the CMOS circuit is formed. This p-channel TFT 902 has a channel formation region 846*d*, the impurity regions 846*b* and 846*c* formed outside the gate electrode, and a high concentration impurity region 846*a* functioning as a source or drain region. The n-channel TFT 903 has a channel formation region 825*c*, a low concentration impurity region 825*b* (GOLD region) overlapping with the first conductive layer 830*a* that is partially included in the gate electrode, and a high concentration impurity region 825*a* functioning as a source or drain region.

The pixel TFT 904 of the pixel portion has a channel formation region 826*c*, a low concentration impurity region 826*b* (LDD region) formed outside the gate electrode, and a high concentration impurity region 826*a* functioning as a source or drain region. An impurity element imparting p-type conductivity is added to each of semiconductor layers 847*a* and 847*b* functioning as one of electrodes of the storage capacitor 905. The storage capacitor 905 includes the insulating film 844 as a dielectric body, the electrode (stacked layer of 838*a* and 838*b*), and the semiconductor layers 847*a* to 847*c*.

In the pixel structure of this embodiment, an end portion of the pixel electrode is arranged to overlap with the source wiring so as not to pass light through a space between the pixel electrodes without using black matrix.

Figure 15:
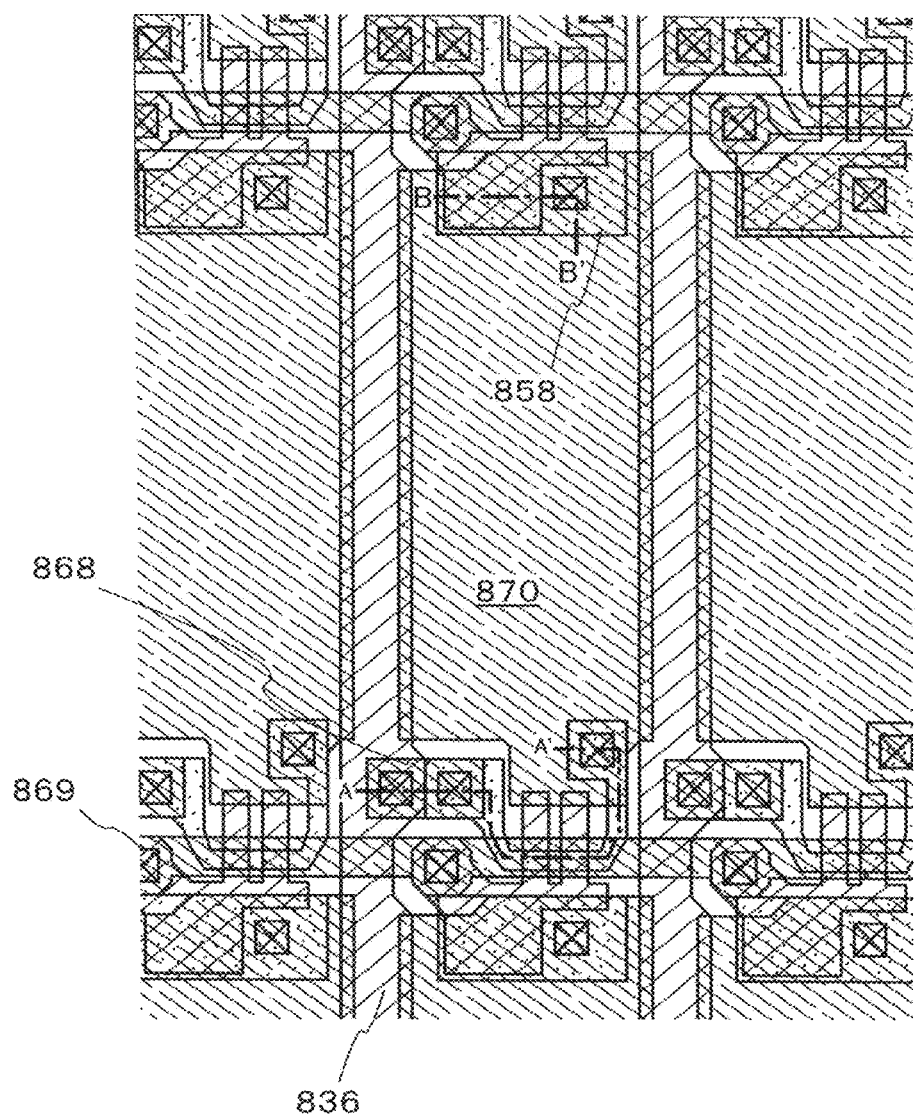
FIG. 15 is a top view of a pixel portion of an active matrix substrate in Embodiment 1 of the present invention.

Further, FIG. 15 shows a top view of the pixel portion of the active matrix substrate manufactured in this embodiment. The portions corresponding to FIGS. 11A to 14C are denoted by the same reference numerals. A dotted line A-A' in FIG. 14C corresponds to a cross-sectional view taken along a dotted line A-A' in FIG. 15. Further, a dotted line B-B' in FIG. 14C corresponds to a cross-sectional view taken along a dotted line B-B' in FIG. 15.

Embodiment 2

Figure 16:
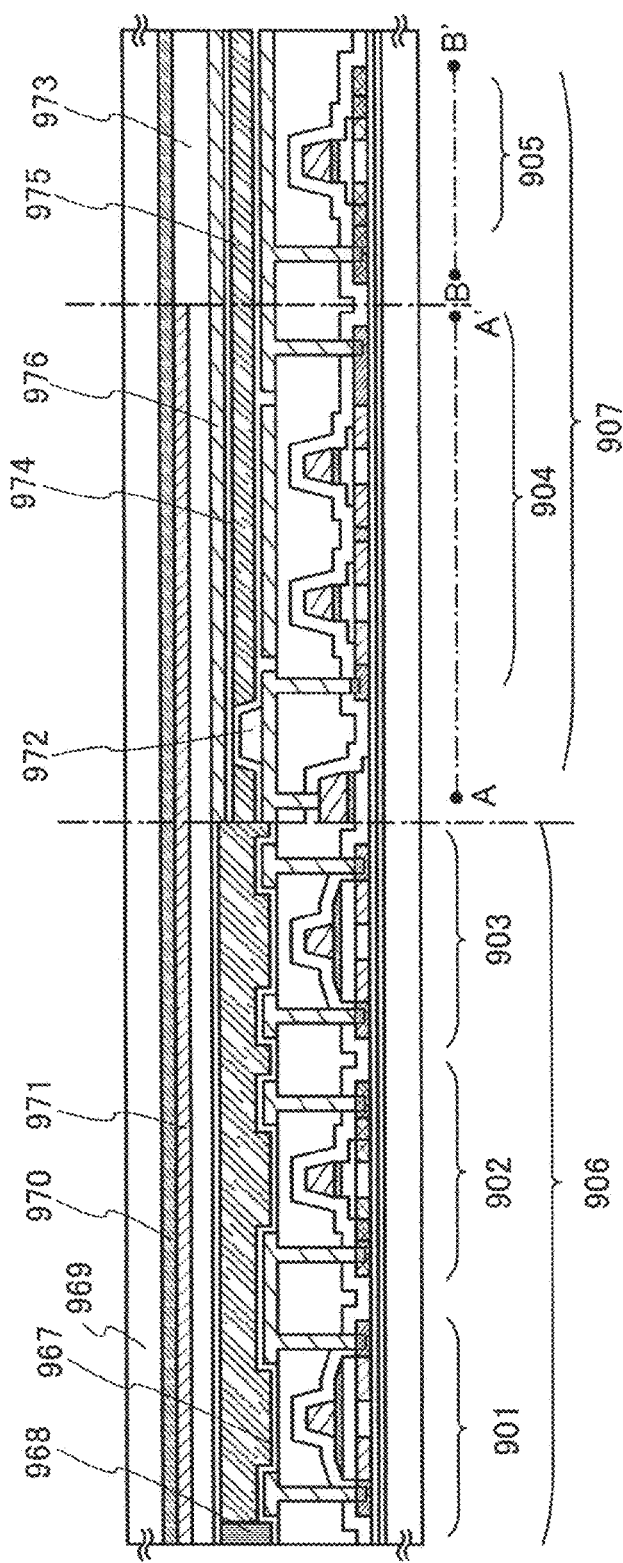
FIG. 16 is a cross-sectional view illustrating a manufacturing step of an active-matrix liquid crystal display device in Embodiment 2 of the present invention

This embodiment will describe below steps of manufacturing a reflective liquid crystal display device from the active matrix substrate manufactured in Embodiment 1. FIG. 16 is used for description.

First, after the active matrix substrate of FIG. 14C is obtained in accordance with Embodiment 1, an alignment film 967 is formed over the active matrix substrate of FIG. 14C, at least over the pixel electrode 870, and rubbing treatment is performed. In this embodiment, before the alignment film 967 is formed, a columnar spacer 972 for keeping a substrate interval is formed in a desired position by patterning an organic resin film such as an acrylic resin film. Instead of a columnar spacer, a spherical spacer may be dispersed entirely on the substrate surface.

Next, a counter substrate 969 is prepared. Then, colored layers 970 and 971 and a planarization film 973 are formed on the counter substrate 969. The red colored layer 970 and the blue colored layer 971 overlap to form a light-shielding portion. Alternatively, the red colored layer and a green colored layer may partially overlap to form a light-shielding portion.

In this embodiment, a substrate shown in Embodiment 1 is used. Accordingly, in FIG. 15 showing a top view of the pixel portion of Embodiment 1, it is necessary to shield at least spaces between the gate wiring 869 and the pixel electrode 870, the gate wiring 869 and the connection electrode 868, and the connection electrode 868 and the pixel electrode 870 from light. In this embodiment, each colored layer is arranged so that light-shield portions of the stacked colored layers overlap with the positions where light is to be blocked, and the counter substrate is attached.

In such a manner, spaces between the pixels are shielded with the light-shielded portions of the stacked colored layers without forming a light-shield layer such as a black mask, whereby the number of steps can be reduced.

Next, a counter electrode 976 formed using a transparent conductive film on the planarization film 973 is formed at least in the pixel portion, an alignment film 974 is formed on the entire surface of the counter substrate, and rubbing treatment is performed.

Then, the active matrix substrate provided with the pixel portion and the driver circuit is attached to the counter substrate with a sealant 968. The sealant 968 contains filler. The two substrates can be attached to have a uniform interval therebetween due to this filler and the columnar spacer. After that, a liquid crystal material 975 is injected between both substrates, and the substrates are completely sealed with a sealing material (not shown). The liquid crystal material 975 may be a known liquid crystal material. In such a manner, a reflective liquid crystal display device shown in FIG. 16 is completed. If needed, the active matrix substrate or the counter substrate is cut into the desired shape. Furthermore, a polarizing plate (not shown) is attached to only the counter substrate. Then, an FPC is attached using a known technique.

A liquid crystal display panel manufactured as described above can be used for a display portion of various kinds of electronic devices.

Embodiment 3

This embodiment will describe an example in which a light-emitting device is manufactured by the present invention. In this specification, the light-emitting device is a generic term for a display panel where a light-emitting element formed over a substrate is sealed between the substrate and a cover material, and for a display module having the display panel equipped with an IC. Note that the light-emitting element has a layer containing an organic compound generating electroluminescence by applying an electric field (light-emitting layer), an anode layer, and a cathode layer. The luminescence in the organic compound includes one or both of the light emission (fluorescence) when exciton returns to the ground state from the singlet-excited state, and the light emission (phosphorescence) when exciton returns to the ground state from the triplet-excited state.

Figure 17:
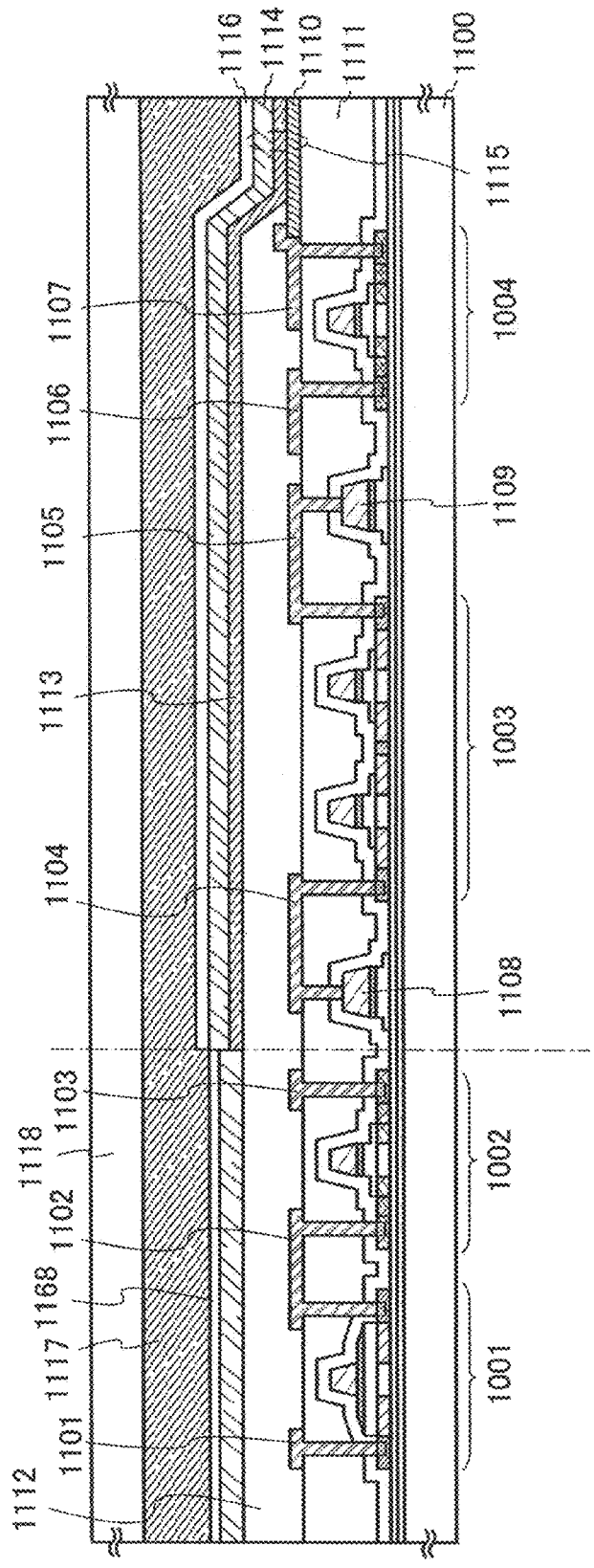
FIG. 17 is a cross-sectional view of a structure of a driver circuit and a pixel portion of a light-emitting device in Embodiment 3 of the present invention.

FIG. 17 is a cross-sectional view of the light-emitting device of this embodiment. A switching TFT 1003 provided over a substrate 1100 in FIG. 17 is formed using the n-channel TFT 903 in FIG. 14C. Accordingly, a structure of the switching TFT 1003 is the same as that of the n-channel TFT 903 in FIG. 14C.

Although a double gate structure in which two channel formation regions are formed is employed in this embodiment, a single gate structure in which one channel formation region is formed or a triple gate structure in which three channel formation regions are formed may be employed.

A driver circuit provided over the substrate 1100 is formed using the CMOS circuit of FIG. 14C. Accordingly, a structure of the driver circuit is the same as those of the n-channel TFT 901 and the p-channel TFT 902 in FIG. 14C. Note that the driver circuit has a single gate structure in this embodiment, but the driver circuit may have a double gate structure or a triple gate structure.

Wirings 1101 and 1103 each serve as a source wiring of the CMOS circuit, and a wiring 1102 serves as a drain wiring. A wiring 1104 serves as a wiring that electrically connects a source wiring 1108 and a source region of the switching TFT. A wiring 1105 serves as a wiring that electrically connects a drain wiring 1109 and a drain region of the switching TFT.

A current control TFT 1004 is formed using the p-channel TFT 902 of FIG. 14C. Accordingly, a structure of the current control TFT 1004 is the same as that of the p-channel TFT 902 in FIG. 14C. The current control TFT has a single gate structure in this embodiment, but the current control TFT may have a double gate structure or a triple gate structure.

A wiring 1106 is a source wiring (corresponding to a current supply line) of the current control TFT 1004. A wiring 1107 is an electrode that is electrically connected to a pixel electrode 1110 when the wiring 1107 overlaps with the pixel electrode 1110.

Note that the pixel electrode 1110 functions as an anode of the light-emitting element formed of a transparent conductive film. The transparent conductive film can be formed using a compound of indium oxide and tin oxide, a compound of indium oxide and zinc oxide, zinc oxide, tin oxide, or indium oxide. Moreover, the transparent conductive film doped with gallium may also be used. The pixel electrode 1110 is formed over a flat interlayer insulating film 1111 before forming those wirings. In this embodiment, it is very important to planarize the steps due to the TFTs using the interlayer insulating film 1111 including resin. The light-emitting layer formed later is so thin that the emission defect might occur due to the steps. Therefore, it is preferable to planarize the surface before forming the pixel electrode so that the light-emitting layer is formed on the plane as flat as possible.

After formation of the wirings 1101 to 1107, a partition 1112 is formed as shown in FIG. 17. The partition 1112 may be formed by pattering an insulating film containing silicon or an organic resin film each having a thickness of 100 to 400 nm.

Note that attention is needed to be paid for the element when the partition 1112 is formed so that the element may not be damaged due to static electricity because the partition 1112 is an insulating film. In this embodiment, the resistivity is lowered by adding a carbon particle or a metal particle in the insulating film, which is a material for the partition 1112, so as to prevent the static electricity. In such a case, the amount of the carbon particles or the metal particles is adjusted so that the resistivity ranges from $1\times10^6$ to $1\times10^{12}$ $\Omega$m (preferably from $1\times10^8$ to $1\times10^{10}$ $\Omega$m).

A light-emitting layer 1113 is formed over the pixel electrode 1110. Although FIG. 17 shows only one pixel, each of light-emitting layers corresponding to each color of R (red), G (green) or B (blue) are made in this embodiment. In addition, in this embodiment, a low-molecular organic light-emitting material is formed by an evaporation method. Specifically, a stacked structure is employed in which a 20-nm-thick copper phthalocyanine (CuPc) film is formed as a hole-injecting layer, and a 70-nm-thick tris-8-quinolinolato aluminum complex ($Alq_3$) film is formed thereover as the light-emitting layer. Adding the fluorescent pigment such as quinacridone, perylene, DCM1, or the like to $Alq_3$ can control the emission color.

However, the above is an example of the organic light-emitting material available as the light-emitting layer, and the material is not limited at all to those described above. The light-emitting layer, a charge-transporting layer, and a charge-injecting layer may be freely combined to form the light-emitting layer (the layer for emitting light and for moving the carrier for the light emission). For instance, although this embodiment shows an example in which the low-molecular organic light-emitting material is employed for the light-emitting layer, a high-molecular organic light-emitting material may also be employed. In addition, an inorganic material such as silicon carbide can also be used as the charge-transporting layer and the charge-injecting layer. These organic light-emitting material and inorganic material may be known materials.

Next, a cathode 1114 formed of a conductive film is provided over the light-emitting layer 1113. In this embodiment, an alloy film of aluminum and lithium is used as the conductive film. A known MgAg film (an alloy film of magnesium and silver) may be used. A conductive film made from an element belonging to Group 1 or 2 of the periodic table or a conductive film to which the element is added may be used as a material of the cathode 1114.

When the steps are conducted up to formation of the cathode 1114, a light-emitting element 1115 is completed. Note that the light-emitting element 1115 mentioned here is a diode including the pixel electrode 1110 (anode), the light-emitting layer 1113, and the cathode 1114.

It is effective to provide a passivation film 1116 so as to completely cover the light-emitting element 1115. The passivation film 1116 is formed using an insulating film including a carbon film, a silicon nitride film, or a silicon nitride oxide film in a single-layer structure or in a stacked structure.

Here, a film with good coverage is preferably used for the passivation film, and it is effective to employ a carbon film, especially a DLC (diamond-like carbon) film. Since the DLC film can be formed at temperatures ranging from the room temperature to 100° C. or less, the DLC film can be easily formed over the light-emitting layer 1113 having low heat resistance. Moreover, the DLC film has a high blocking effect against oxygen, and therefore, it is possible to suppress oxidization of the light-emitting layer 1113. Therefore, using the DCL film can prevent the light-emitting layer 1113 from being oxidized during the following sealing step.

Moreover, a sealing material 1117 is provided over the passivation film 1116 to paste a cover material 1118. A UV curable resin may be used as the sealing material 1117 and it is effective to provide a moisture absorption material or an antioxidant material inside. In addition, in this embodiment, the cover material 1118 is a glass substrate, a quartz substrate, or a plastic substrate (including a plastic film), each having carbon films (preferably DLC films) formed on opposite sides of the substrate.

Thus, the light-emitting device having the structure shown in FIG. 17 is completed. It is effective to perform continuously all the steps after forming the partition 1112 up to forming the passivation film 1116 in a film-forming apparatus of a multi-chamber type (or an in-line type) without being exposed to the air. Furthermore, it is possible to conduct the steps up to pasting the cover material 1118 continuously without being exposed to the air.

Thus, an n-channel TFT 1001, a p-channel TFT 1002, the switching TFT (n-channel TFT) 1003, and the current control TFT (n-channel TFT) 1004 are formed over the substrate 1100. The number of masks needed in these manufacturing steps up to here is less than that needed in manufacturing steps of a general active matrix light-emitting device.

That is to say, the step of manufacturing a TFT is simplified to a large degree, thereby improving the yield and reducing the production cost.

In addition, as described with FIG. 17, the provision of the impurity region overlapping the gate electrode with the insulating film interposed therebetween can form the n-channel TFT that has enough resistance against deterioration due to a hot-carrier effect. Therefore, a light-emitting device with high reliability can be obtained.

Although this embodiment shows only the structures of the pixel portion and the driver circuit, another logical circuit such as a signal division circuit, a D/A converter, an operational amplifier, a γ correction circuit, and the like can be further formed on the same insulator according to the manufacturing steps in this embodiment. Moreover, a memory and a microprocessor can be further formed.

Further, a light-emitting device of this embodiment in which the step up to sealing (or filling and sealing) for protecting the light-emitting element has been completed will be described with reference to FIGS. 18A and 18B. Note that the reference numerals used in FIG. 17 are referred as needed.

Figure 18A:
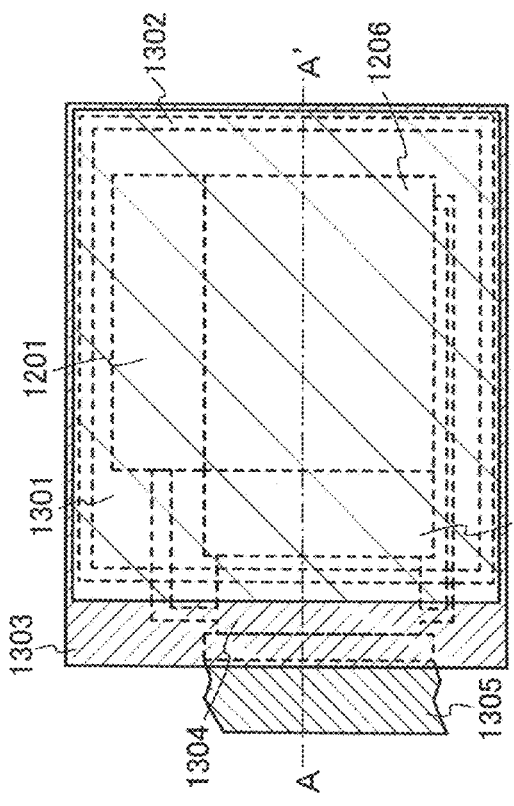
FIG. 18A is a top view showing a driver circuit and a pixel portion of a light-emitting device in Embodiment 3 of the present invention.
Figure 18B:
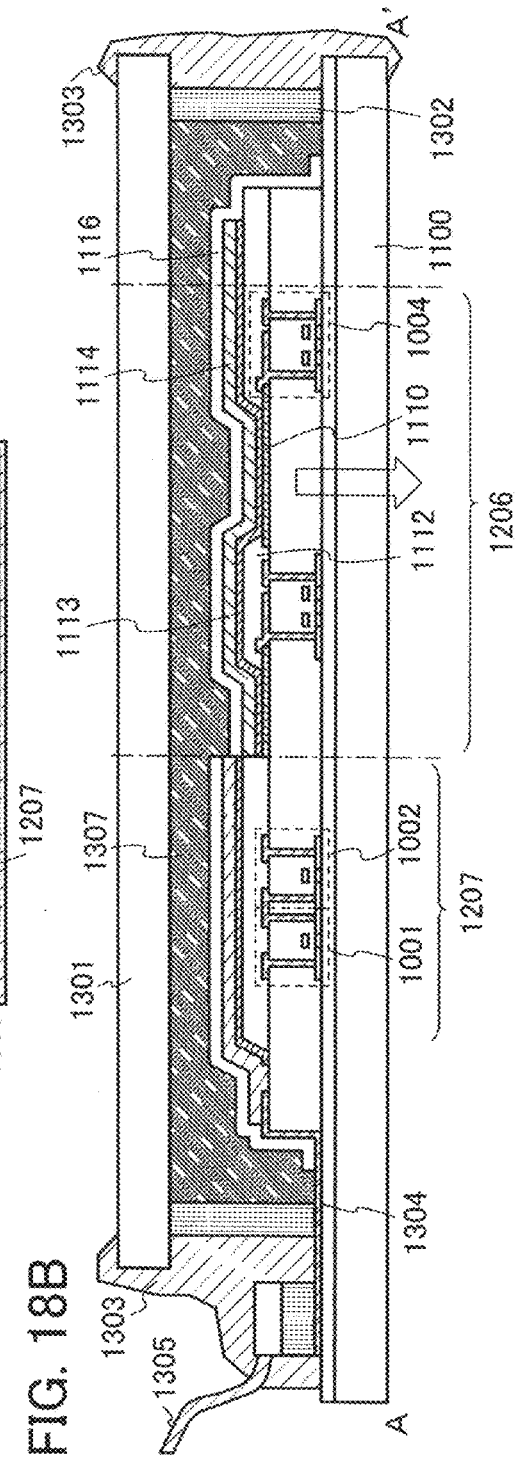
FIG. 18B is a cross-sectional view thereof.

FIG. 18A is a top view showing a state in which the step up to sealing of the light-emitting element has been performed. FIG. 18B is a cross-sectional view taken along a line A-A' in FIG. 18A. In FIG. 18A, a reference numeral 1201 indicated by a dotted line denotes a source driver circuit; 1206, a pixel portion; 1207, a gate driver circuit; 1301, a cover material; 1302, a first sealant; 1303, a second sealant; and 1307, a sealing material provided in the space surrounded by the first sealant 1302.

Note that a reference numeral 1304 denotes a wiring that transmits a signal inputted to the source driver circuit 1201 and the gate driver circuit 1207 and receives a video signal and a clock signal from an FPC 1305 (flexible printed circuit) that is to be an external input terminal. Although only the FPC is shown here, this FPC may be provided with a print wiring board (PWB). The light-emitting device in this specification includes not only the light-emitting device itself but also the light-emitting device equipped with the FPC or a PWB.

Next, a cross-sectional structure is described with reference to FIG. 18B. The pixel portion 1206 and the gate driver circuit 1207 are formed over the substrate 1100, and the pixel portion 1206 includes a plurality of pixels including the current control TFT 1004 and the pixel electrode 1110 that is electrically connected to the drain of the current control TFT 1004. The gate driver circuit 1207 includes the CMOS circuit (see FIG. 14C) in which the n-channel TFT 1001 and the p-channel TFT 1002 are combined.

The pixel electrode 1110 serves as an anode of the light-emitting element. In addition, the partition 1112 is formed at both ends of the pixel electrode 1110. The light-emitting layer 1113 and the cathode 1114 of the light emitting element are formed over the pixel electrode 1110.

The cathode 1114 also serves as the wiring common to all the pixels and is electrically connected to the FPC 1305 through the connection wiring 1304. Further, all the elements included in the pixel portion 1206 and the gate driver circuit 1207 are covered with the cathode 1114 and the passivation film 1116.

Moreover, the cover material 1301 is pasted with the first sealant 1302. A spacer including a resin film may be provided in order to keep the space between the cover material 1301 and the light-emitting element. The inside of the first sealant 1302 is filled with the sealing material 1307. It is preferable to employ an epoxy resin as the first sealant 1302 and the sealing material 1307. In addition, it is desirable to employ a material which hardly transmits moisture and oxygen to the first sealant 1302. Further, a moisture absorption material or an antioxidant material may be included inside the sealing material 1307.

The sealing material 1307 provided so as to cover the light-emitting element also serves as an adhesive to paste the cover material 1301. In addition, FRP (Fiberglass-Reinforced Plastics), PVF (polyvinyl fluoride), polyester, or acrylic can be employed as the material for a plastic substrate constituting a part of the cover material 1301 in this embodiment.

After bonding the cover material 1301 with the use of the sealing material 1307, a second sealant 1303 is provided so as to cover the side surface (the exposed surface) of the sealing material 1307. The second sealant 1303 can be formed using the same material as that of the first sealant 1302.

The light-emitting element is filled and sealed with the sealant 1307 in such a structure as described, whereby the light-emitting element can be completely shield from the outside, and a substance promoting deterioration caused by oxidation of the light-emitting layer due to moisture, oxygen, and the like can be prevented from penetrating from the outside. Accordingly, a light-emitting device with high reliability can be obtained.

Embodiment 4

This embodiment will describe a semiconductor device of the present invention in which an active matrix display device including a TFT circuit is incorporated, with reference to drawings.

As such a semiconductor device, a portable information terminal (such as an electronic notebook, a mobile computer, and a cellular phone), a video camera, a still camera, a personal computer, a television, and the like can be given. Examples thereof are shown in FIGS. 19A to 21D.

Figure 19A:
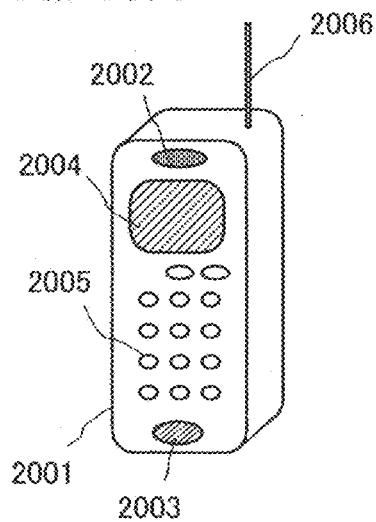
FIGS. 19A to 19E are diagrams each showing an example of a semiconductor device in Embodiment 3 of the present invention.

FIG. 19A is a cellular phone, which includes a main body 2001, an audio output portion 2002, an audio input portion 2003, a display device 2004, operation switches 2005, and an antenna 2006. The present invention can be applied to the audio output portion 2002, the audio input portion 2003, and the display device 2004 provided with an active matrix substrate.

Figure 19B:
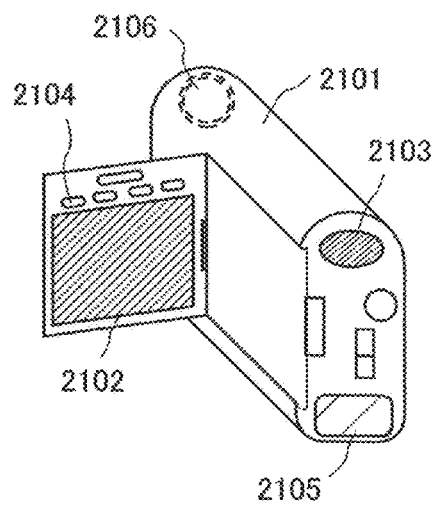

FIG. 19B is a video camera, which includes a main body 2101, a display device 2102, an audio input portion 2103, operation switches 2104, a battery 2105, and an image receiving portion 2106. The present invention can be applied to the audio input portion 2103, the display device 2102 provided with an active matrix substrate, and the image receiving portion 2106.

Figure 19C:
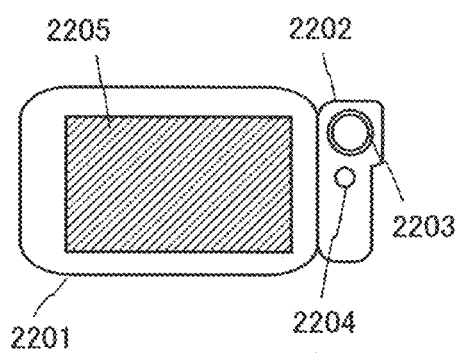

FIG. 19C is a mobile computer or a portable information terminal, which includes a main body 2201, a camera portion 2202, an image receiving portion 2203, an operation switch 2204, and a display device 2205. The present invention can be applied to the image receiving portion 2203 and the display device 2205 provided with an active matrix substrate.

Figure 19D:
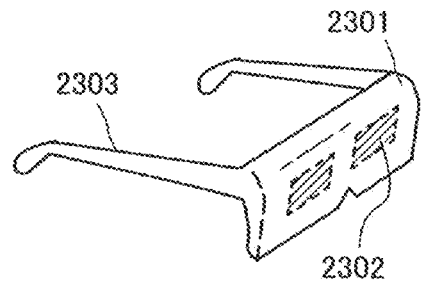

FIG. 19D is a goggle display, which includes a main body 2301, a display device 2302, and an arm portion 2303. The present invention can be applied to the display device 2302. Although not shown, the present invention can be used for another signal control circuit.

Figure 19E:
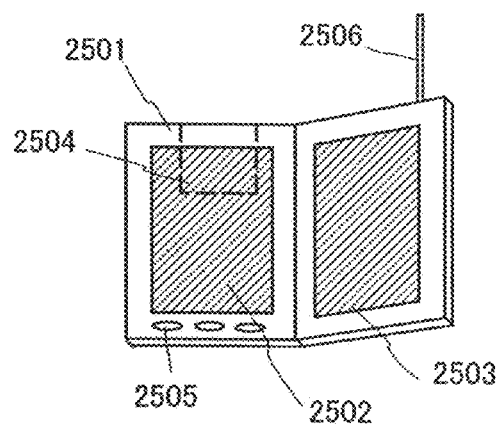

FIG. 19E is a portable book, which includes a main body 2501, display devices 2502 and 2503, a storage medium 2504, operation switches 2505, and an antenna 2506, and displays data stored in mini discs (MD) or DVDs (Digital Versatile Disc) and data received at the antenna. The display devices 2502 and 2503 are direct view-type display devices, and the present invention can be applied thereto.

Figure 20A:
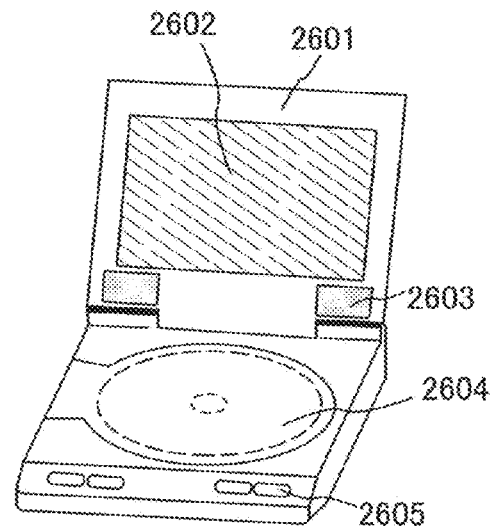
FIGS. 20A to 20C are diagrams each showing an example of a semiconductor device in Embodiment 4 of the present invention.

FIG. 20A is a record player using a recording medium that records programs (hereinafter, refer to as a recording medium), which includes a main body 2601, a display device 2602, a speaker portion 2603, a recording medium 264, and an operation switch 2605. Note that by using a DVD, a CD, or the like as the recording medium, this device can be used for listening music, watching movie, games, and the Internet. The present invention can be applied to the display device 2602.

Figure 20B:
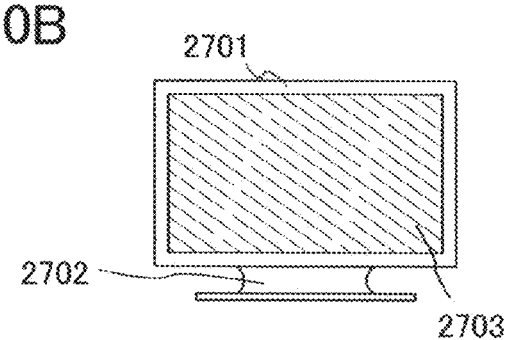

FIG. 20B is a television, which includes a main body 2701, a support base 2702, and a display portion 2703. The present invention can be applied to the display portion 2703.

Figure 20C:
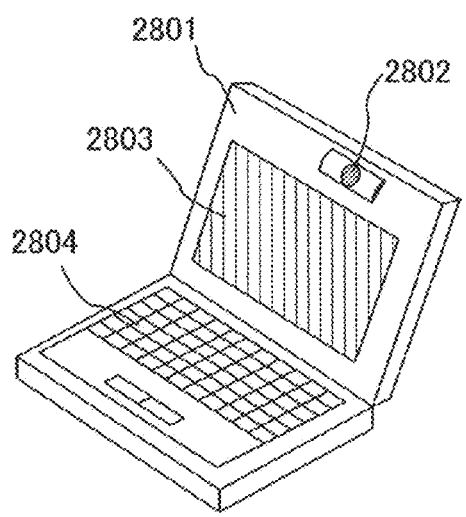

FIG. 20C is a personal computer, which includes a main body 2801, an image input portion 2802, a display device 2803, and a keyboard 2804. The present invention can be applied to the display device 2803.

Figure 21A:
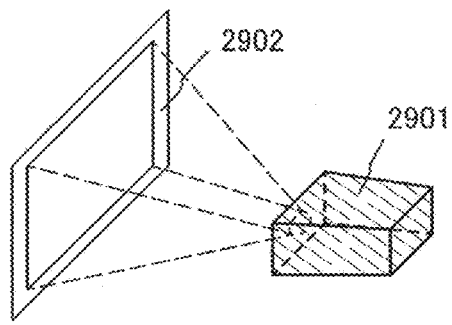
FIGS. 21A to 21D are diagrams each showing an example of a semiconductor device in Embodiment 5 of the present invention.

FIG. 21A is a front projector, which includes a projection device 2901 and a screen 2902. The present invention can be applied to the projection device and another signal control circuit.

Figure 21B:
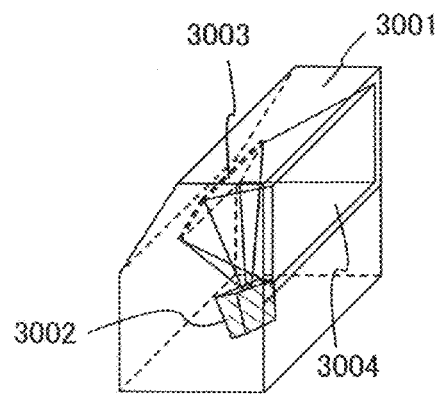

FIG. 21B is a rear projector, which includes a main body 3001, a projection device 3002, a mirror 3003, and a screen 3004. The present invention can be applied to the projection device and another signal control circuit.

Figure 21C:
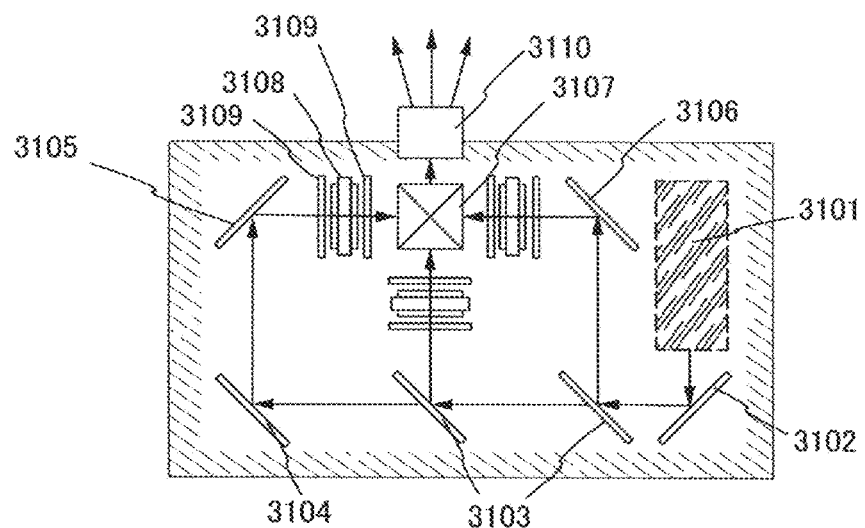

FIG. 21C is a diagram illustrating a structural example of the projection devices 2901 and 3002 in FIGS. 21A and 21B. The projection devices 2901 and 3002 each include a light-source optical system 3101, mirrors 3102 and 3104 to 3106, a dichroic mirror 3103, a prism 3107, a liquid crystal display device 3108, a retardation film 3109, and a projection optical system 3110. The projection optical system 3110 is constituted by an optical system including a projection lens. Although an example of a three-plate mode is shown in this embodiment, the mode is not particularly limited to this, and for example, a single-plate mode may be employed. A practitioner may provide an optical system such as an optical lens, a film having polarizing function, a film for adjustment of a phase difference, or an IR film as appropriate in a light path as indicated by arrows in FIG. 21C.

Figure 21D:
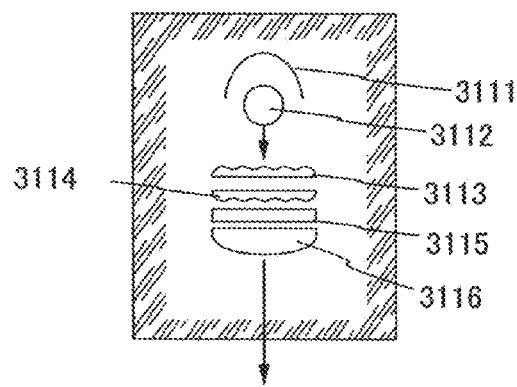

FIG. 21D is a diagram illustrating a structural example of the light-source optical system 3101 in FIG. 21C. In this embodiment, the light-source optical system 3101 includes a reflector 3111, a light source 3112, lens arrays 3113 and 3114, a polarization-conversion 3115, and a condensing lens 3116. Note that the light-source optical system shown in FIG. 21D is just an example, and it is not particularly limited to this. For example, a practitioner may provide an optical system such as an optical lens, a film having polarizing function, a film for adjustment of a phase difference, or an IR film as appropriate in the light-source optical system.

In addition, the present invention can be applied to a light-emitting display element. In such a manner, the present invention can be applied in quite a wide range and can be applied to electronic appliances of every field.

This application is based on Japanese Patent Application serial no. 2007-077217 filed with Japan Patent Office on Mar. 23, 2007, the entire contents of which are hereby incorporated by reference.

What is claimed is:

1. A method for manufacturing a semiconductor device comprising the steps of:
   forming an amorphous silicon film over an insulating substrate;
   forming a cap film over the amorphous silicon film;
   irradiating the amorphous silicon film through the cap film with a pulsed laser beam with repetition rate of 10 MHz or more, while the insulating substrate is scanned, to melt the amorphous silicon film, so that a crystalline silicon film including a crystalline region in which crystal planes in a perpendicular direction to a surface of the crystalline silicon film are orientated along one of {001}, {211}, and {101} is formed in accordance with a scanning speed of the insulating substrate and a power of the laser beam.

2. A method for manufacturing a semiconductor device according to claim 1,
   wherein the crystal planes are orientated along {001} under a condition of,
   at the scanning speed x (cm/sec) of 10 cm/sec or more and less than or equal to 20 cm/see, the power y (W) satisfies the following Formula 1 or more and less than the following Formula 2; and
   at the scanning speed x (cm/sec) of 20 cm/sec or more and less than 35 cm/sec, the power y (W) satisfies the following Formula 1 or more and less than the following Formula 3

$$y=0.0012x^2+0.083x+4.4 \quad \text{(Formula 1)}$$

$$y=0.28x+4.2 \quad \text{(Formula 2)}$$

$$y=-0.0683x+11.167 \quad \text{(Formula 3)}$$

3. A method for manufacturing a semiconductor device according to claim 1,
   wherein the crystal planes are orientated along {211} under a condition of,
   at the scanning speed x (cm/sec) of 10 cm/sec and less than or equal to 20 cm/sec, the power y (W) satisfies the following Formula 2 or more and less than the following Formula 4;
   at the scanning speed x (cm/sec) of 20 cm/sec or more and less than 35 cm/sec, the power y (W) satisfies the following Formula 3 or more and less than the following Formula 4; and
   at the scanning speed x (cm/sec) of 35 cm/sec or more and less than 55 cm/sec, the power y (W) satisfies the following Formula 1 or more and less than the following Formula 5

$$y=0.0012x^2+0.083x+4.4 \quad \text{(Formula 1)}$$

$$y=0.28x+4.2 \quad \text{(Formula 2)}$$

$$y=-0.0683x+11.167 \quad \text{(Formula 3)}$$

$$y=0.0027x^2+0.36x+4.2 \quad \text{(Formula 4)}$$

$$y=-0.37x+33 \quad \text{(Formula 5)}$$

4. A method for manufacturing a semiconductor device according to claim 1;
   wherein the cap film is $SiN_xO_y$ ($0 \le x \le 4/3$, $0 \le y \le 2$, $0 \le 3x+2y \le 4$).

5. A method for manufacturing a semiconductor device according to claim 1,
   wherein a thickness of the cap film is greater than or equal to 200 nm and less than or equal to 1000 nm.

6. A method for manufacturing a semiconductor device according to claim 1,
   wherein the crystal planes are orientated along {101} under a condition of,
   at the scanning speed x (cm/sec) of 70 cm/sec or more and less than or equal to 90 cm/sec, the power y (W) satisfies the following Formula 1 or more, and less than 27W $$y=0.0012x^2+0.083x+4.4 \quad \text{(Formula 1)}$$

7. A method for manufacturing a semiconductor device according to claim 1, further comprising:
   forming a metal film over the crystalline silicon film; and
   reacting the crystalline silicon film with the metal film.

8. A method for manufacturing a semiconductor device according to claim 7,
   wherein the metal film contains any of Ni, Co, Pt, Pd, or Cr as its main component.

9. A method for manufacturing a semiconductor device according to claim 1, wherein the cap film is a silicon oxynitride film formed by a plasma CVD method.

10. A method for manufacturing a semiconductor device comprising the steps of:
    forming an amorphous silicon film over an insulating substrate;
    forming a cap film over the amorphous silicon film;
    irradiating the amorphous silicon film through the cap film with a pulsed laser beam with repetition rate of 10 MHz or more, while the insulating substrate is scanned, to melt the amorphous silicon film, so that a first crystalline silicon film including a crystalline region in which crystal planes in a perpendicular direction to a surface of the first crystalline silicon film are orientated along one of {001}, {211}, and {101} is formed in a first portion and a second crystalline silicon film including a crystalline region in which crystal planes in a perpendicular direction to a surface of the second crystalline silicon film are orientated along another of {001}, {211}, and {101} is formed in a second portion, by changing a scanning speed of the insulating substrate and a power of the laser beam; and
    forming a first channel region, a first source region, and a first drain region using the first crystalline silicon film and a second channel region, a second source region, and a second drain region using the second crystalline silicon film.

11. A method for manufacturing a semiconductor device according to claim 10,
wherein the crystal planes are orientated along {001} under a condition of,
at the scanning speed x (cm/sec) of 10 cm/sec or more and less than or equal to 20 cm/sec, the power y (W) satisfies the following Formula 1 or more and less than the following Formula 2; and
at the scanning speed x (cm/sec) of 20 cm/sec or more and less than 35 cm/sec, the power y (W) satisfies the following Formula 1 or more and less than the following Formula 3

$$y=0.0012x^2+0.083x+4.4 \quad \text{(Formula 1)}$$

$$y=0.28x+4.2 \quad \text{(Formula 2)}$$

$$y=-0.0683x+11.167 \quad \text{(Formula 3)}$$

12. A method for manufacturing a semiconductor device according to claim 10,
wherein the crystal planes are orientated along {211} under a condition of,
at the scanning speed x (cm/sec) of 10 cm/sec or more and less than or equal to 20 cm/sec, the power y (W) satisfies the following Formula 2 or more and less than the following Formula 4;
at the scanning speed x (cm/sec) of 20 cm/sec or more and less than 35 cm/sec, the power y (W) satisfies the following Formula 3 or more and less than the following Formula 4; and
at the scanning speed x (cm/sec) of 35 cm/sec or more and less than 55 cm/sec, the power y (W) satisfies the following Formula 1 or more and less than the following Formula 5

$$y=0.0012x^2+0.083x+4.4 \quad \text{(Formula 1)}$$

$$y=0.28x+4.2 \quad \text{(Formula 2)}$$

$$y=-0.0683x+11.167 \quad \text{(Formula 3)}$$

$$y=0.0027x^2+0.36x+4.2 \quad \text{(Formula 4)}$$

$$y=-0.37x+33. \quad \text{(Formula 5)}$$

13. A method for manufacturing a semiconductor device according to claim 10;
wherein the cap film is $SiN_xO_y$ ($0 \le x \le 4/3$, $0 \le y \le 2$, $0 \le 3x+2y \le 4$).

14. A method for manufacturing a semiconductor device according to claim 10,
wherein a thickness of the cap film is greater than or equal to 200 nm and less than or equal to 1000 nm.

15. A method for manufacturing a semiconductor device according to claim 10,
wherein the crystal planes are orientated along {101} under a condition of,
at the scanning speed x (cm/sec) of 70 cm/sec or more and less than or equal to 90 cm/sec, the power y (W) satisfies the following Formula 1 or more, and less than 27W $$y=0.0012x^2+0.083x+4.4 \quad \text{(Formula 1)}$$

16. A method for manufacturing a semiconductor device according to claim 10,
wherein the one is {001} and the another is {211} or {101}, and
wherein the first channel region, the first source region, and the first drain region are included in an n-type transistor and the second channel region, the second source region, and the second drain region are included in a p-type transistor.

17. A method for manufacturing a semiconductor device according to claim 10, further comprising:
forming a metal film over the first crystalline silicon film and the second crystalline silicon film; and
reacting the first crystalline silicon film and the second crystalline silicon film with the metal film.

18. A method for manufacturing a semiconductor device according to claim 17,
wherein the metal film contains any of Ni, Co, Pt, Pd, or Cr as its main component.

19. A method for manufacturing a semiconductor device according to claim 10, wherein the cap film is a silicon oxynitride film formed by a plasma CVD method.

* * * * *

UNITED STATES PATENT AND TRADEMARK OFFICE
CERTIFICATE OF CORRECTION

PATENT NO.        : 9,177,811 B2                    Page 1 of 1
APPLICATION NO.   : 12/076585
DATED             : November 3, 2015
INVENTOR(S)       : Tomoaki Moriwaka It is certified that error appears in the above-identified patent and that said Letters Patent is hereby corrected as shown below:

In the Specification:

Col. 13, line 67, "(Formula 2)" should read --(Formula 5)--

In the Claims:

Col. 31, line 47, "20 cm/see" should read --20 cm/sec,--

Signed and Sealed this
Twenty-second Day of March, 2016

Michelle K. Lee
*Director of the United States Patent and Trademark Office*